(12) United States Patent
Itai et al.

(10) Patent No.: US 11,756,898 B2
(45) Date of Patent: Sep. 12, 2023

(54) SEMICONDUCTOR MEMORY DEVICE

(71) Applicant: KIOXIA CORPORATION, Tokyo (JP)

(72) Inventors: Hideki Itai, Chigasaki (JP); Mitsuhiro Noguchi, Fujisawa (JP); Hiromasa Yoshimori, Yokohama (JP); Hideyuki Tabata, Yokohama (JP); Yasushi Nakajima, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 337 days.

(21) Appl. No.: 17/120,341

(22) Filed: Dec. 14, 2020

(65) Prior Publication Data
US 2022/0005767 A1    Jan. 6, 2022

(30) Foreign Application Priority Data

Jul. 6, 2020 (JP) ................................ 2020-116116

(51) Int. Cl.
*H01L 27/11582* (2017.01)
*H01L 23/00* (2006.01)
(Continued)

(52) U.S. Cl.
CPC ........ *H01L 23/562* (2013.01); *H01L 23/5226* (2013.01); *H10B 41/10* (2023.02);
(Continued)

(58) Field of Classification Search
CPC .................... H01L 27/11578; H01L 27/11582
See application file for complete search history.

(56) References Cited

U.S. PATENT DOCUMENTS 10,134,749 B2    11/2018  Noguchi et al.
10,706,931 B2     7/2020  Maejima
(Continued)

FOREIGN PATENT DOCUMENTS

JP    2017-157260 A    9/2017
JP    2019-169600 A   10/2019
(Continued)

OTHER PUBLICATIONS

U.S. Appl. No. 17/010,217, filed Sep. 2, 2021, 11 pages.

*Primary Examiner* — Christopher A Johnson
(74) *Attorney, Agent, or Firm* — Oblon, McClelland, Maier & Neustadt, L.L.P.

(57) ABSTRACT

A semiconductor memory device includes: two memory blocks; a first structure disposed between the two memory blocks; and a second structure separated from the two memory blocks, or a plurality of second structures. The two memory blocks include a plurality of first conductive layers and a plurality of first insulating layers alternately arranged. The first structure has one end, and the one end is closer to the substrate than the plurality of first conductive layers are. The second structure has one end, and the one end is closer to the substrate than at least apart of the first conductive layers among the plurality of first conductive layers is. Another end of the first structure and another end of the second structure are farther from the substrate than the plurality of first conductive layers are. The second structure is separated from the first structure.

20 Claims, 37 Drawing Sheets

(51) Int. Cl.
*H01L 23/522* (2006.01)
*H10B 41/10* (2023.01)
*H10B 41/27* (2023.01)
*H10B 41/41* (2023.01)
*H10B 43/10* (2023.01)
*H10B 43/27* (2023.01)
*H10B 43/40* (2023.01)

(52) U.S. Cl.
CPC ............ *H10B 41/27* (2023.02); *H10B 41/41* (2023.02); *H10B 43/10* (2023.02); *H10B 43/27* (2023.02); *H10B 43/40* (2023.02)

(56) References Cited

U.S. PATENT DOCUMENTS

| | | |
|---|---|---|
| 2018/0269221 A1 | 9/2018 | Oda et al. |
| 2019/0304991 A1* | 10/2019 | Seo .................. H01L 27/11565 |
| 2020/0235091 A1* | 7/2020 | Kang .................. H01L 23/5225 |
| 2020/0251484 A1 | 8/2020 | Ito et al. |

FOREIGN PATENT DOCUMENTS

| | | |
|---|---|---|
| JP | 2020-126938 A | 8/2020 |
| JP | 2021-136353 A | 9/2021 |

* cited by examiner

SEMICONDUCTOR MEMORY DEVICE

CROSS-REFERENCE TO RELATED APPLICATIONS

This application is based upon and claims the benefit of Japanese Patent Application No. 2020-116116, filed on Jul. 6, 2020, the entire contents of which are incorporated herein by reference.

BACKGROUND

Field

Embodiments described herein relate generally to a semiconductor memory device.

Description of the Related Art

There has been known a semiconductor memory device in which a plurality of memory blocks are arranged in a first direction and extend in a second direction intersecting with the first direction, and the plurality of memory blocks include a plurality of conductive layers arranged in a third direction intersecting with a surface of a substrate.

DETAILED DESCRIPTION

Figure 1:
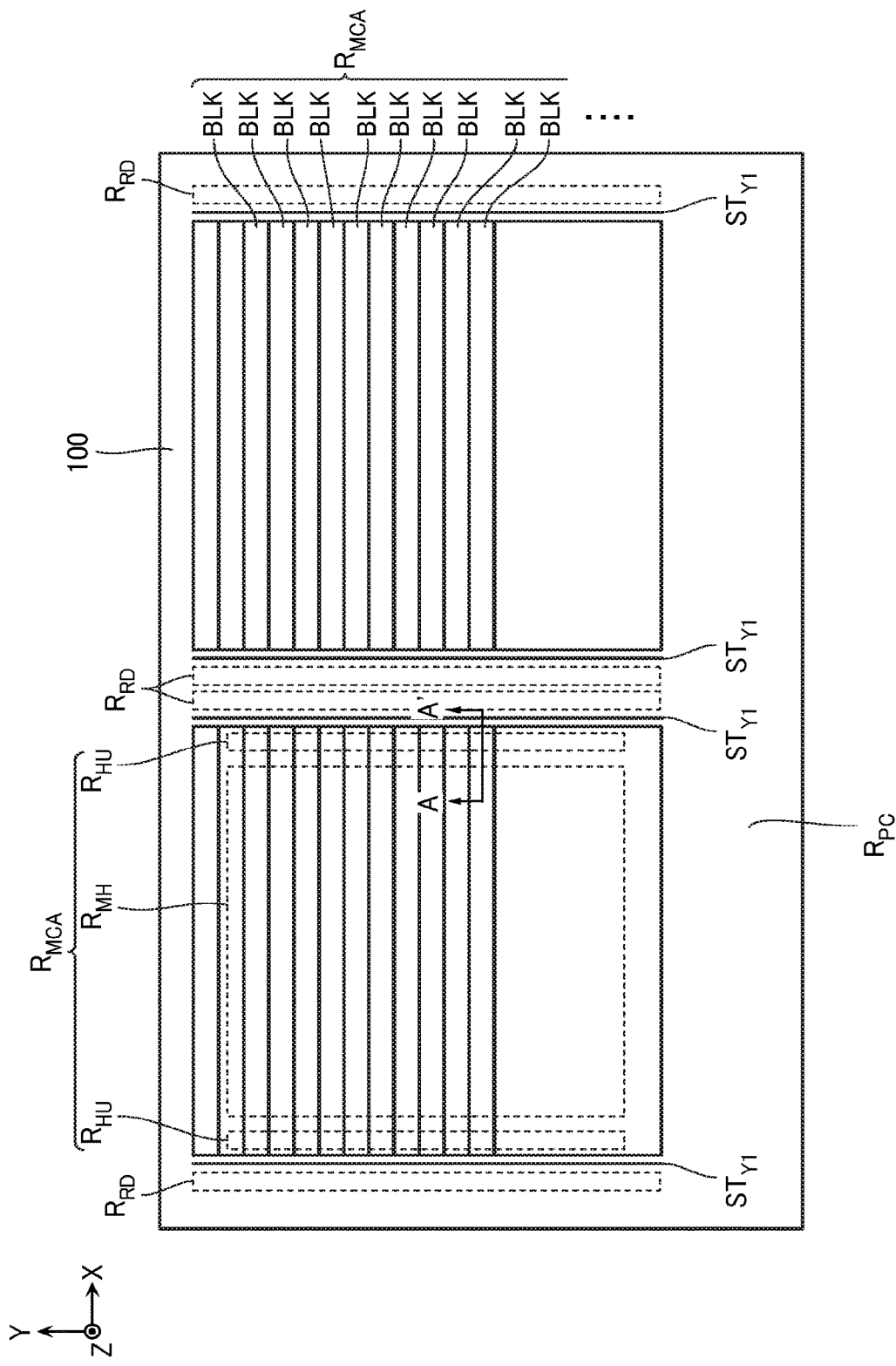
FIG. 1 is a schematic plan view of a semiconductor memory device according to a first embodiment.

A semiconductor memory device according to one embodiment includes a substrate; two memory blocks arranged in a first direction, the two memory blocks extending in a second direction intersecting with the first direction; a first structure disposed between the two memory blocks, the first structure extending in the second direction; a second structure separated from the two memory blocks in the second direction, the second structure extending in the first direction; and a plurality of bit lines arranged in the second direction, the plurality of bit lines extending in the first direction and being connected to the two memory blocks, wherein the two memory blocks include a plurality of first conductive layers and a plurality of first insulating layers alternately arranged in a third direction intersecting with a surface of the substrate, the first structure has one end in the third direction, and the one end is closer to the substrate than the plurality of first conductive layers are, the second structure has one end in the third direction, and the one end is closer to the substrate than at least a part of the first conductive layers among the plurality of first conductive layers is, another end in the third direction of the first structure and another end in the third direction of the second structure are farther from the substrate than the plurality of first conductive layers are and closer to the substrate than the plurality of bit lines are, and the second structure is separated from the first structure in the second direction.

A semiconductor memory device according to one embodiment includes: a substrate; two memory blocks arranged in a first direction, the two memory blocks extending in a second direction intersecting with the first direction; a first structure disposed between the two memory blocks, the first structure extending in the second direction; a plurality of second structures separated from the two memory blocks in the second direction, the plurality of second structures being disposed in the first direction; and a plurality of bit lines arranged in the second direction, the plurality of bit lines extending in the first direction and being connected to the two memory blocks, wherein the two memory blocks include a plurality of first conductive layers and a plurality of first insulating layers alternately arranged in a third direction intersecting with a surface of the substrate, the first structure has one end in the third direction, and the one end is closer to the substrate than the plurality of first conductive layers are, the second structure has one end in the third direction, and the one end is closer to the substrate than at least a part of the first conductive layers among the plurality of first conductive layers is, another end in the third direction of the first structure and another end in the third direction of the second structure are farther from the substrate than the plurality of first conductive layers are and closer to the substrate than the plurality of bit lines are, and the second structure is separated from the first structure in the second direction.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a control die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions, such as "above" and "below," in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like. A length in a predetermined direction may be referred to as a width or a thickness.

In this specification, when referring to a "width," a "length," a "thickness," or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

[Structure]

FIG. 1 is a schematic plan view of a semiconductor memory device according to the embodiment. As illustrated in FIG. 1, the semiconductor memory device according to the embodiment includes a semiconductor substrate 100. In the illustrated example, the semiconductor substrate 100 includes two memory cell array regions $R_{MCA}$ arranged in the X-direction. The memory cell array region $R_{MCA}$ includes a memory hole region $R_{MH}$ and hook-up regions $R_{HU}$ arranged at positions side by side with the memory hole region $R_{MH}$ in the X-direction. The hook-up regions $R_{HU}$ extend in the Y-direction along both ends in the X-direction of the memory hole region $R_{MH}$. Row decoder regions $R_{RD}$ are arranged at positions side by side with the memory cell array region $R_{MCA}$ in the X-direction. The row decoder regions $R_{RD}$ extend in the Y-direction along both ends in the X-direction of the memory cell array region $R_{MCA}$. A peripheral circuit region $R_{PC}$ extending in the X-direction is disposed in an end portion in the Y-direction of the semiconductor substrate 100.

Figure 2:
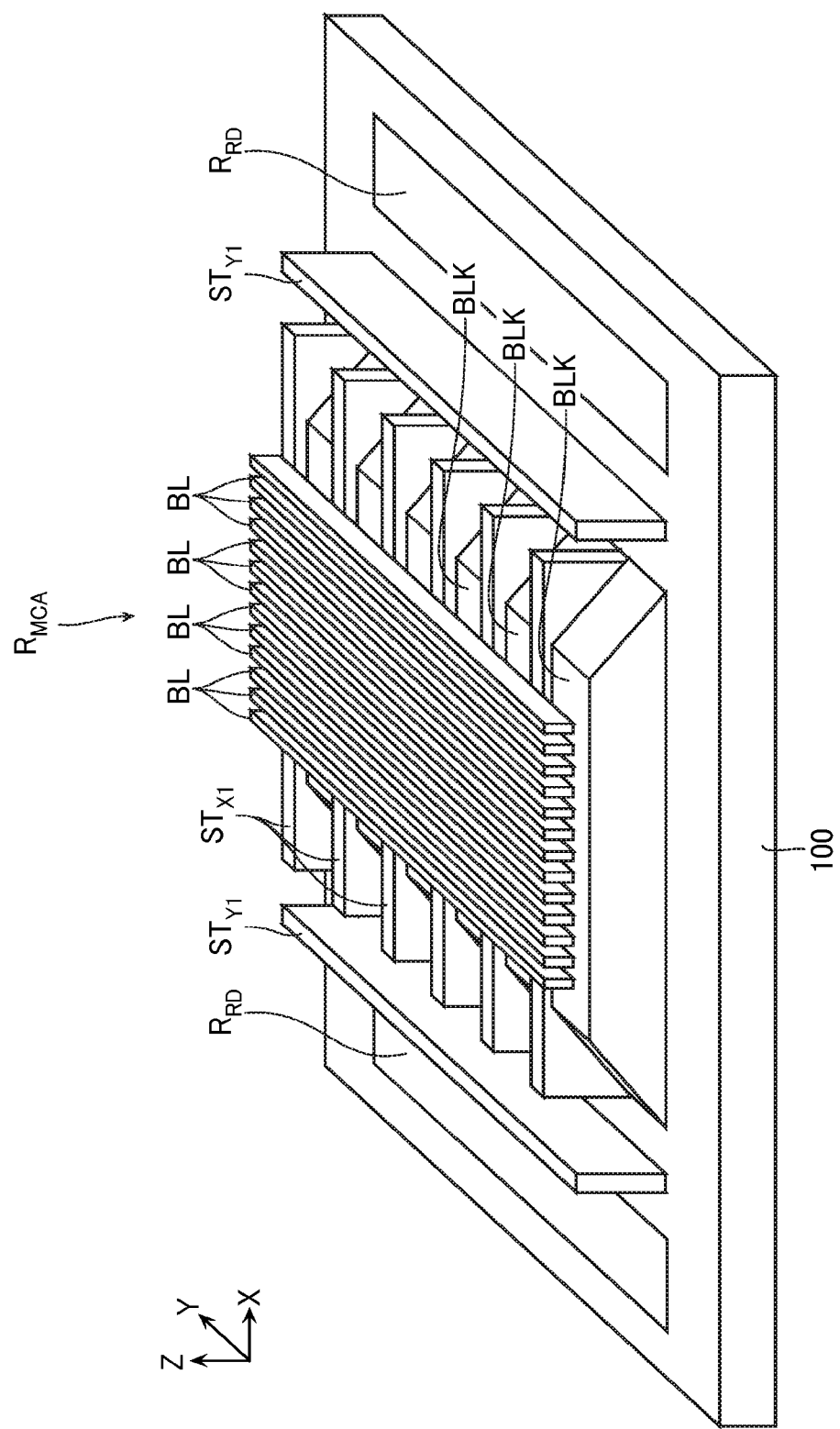
FIG. 2 is a schematic perspective view of a memory cell array region $R_{MCA}$.

FIG. 2 is a schematic perspective view of the memory cell array region $R_{MCA}$. As illustrated in FIG. 2, the memory cell array region $R_{MCA}$ includes a plurality of memory blocks BLK arranged in the Y-direction, inter-block structures $ST_{X1}$, and a plurality of bit lines BL. The inter-block structures $ST_{X1}$ are each disposed between the two memory blocks BLK mutually adjacent in the Y-direction. The plurality of bit lines BL are disposed above the memory blocks BLK and extend in the Y-direction. Block side structures $ST_{Y1}$ extending in the Y-direction are disposed in regions between the memory cell array region $R_{MCA}$ and the row decoder regions $R_{RD}$.

Figure 3:
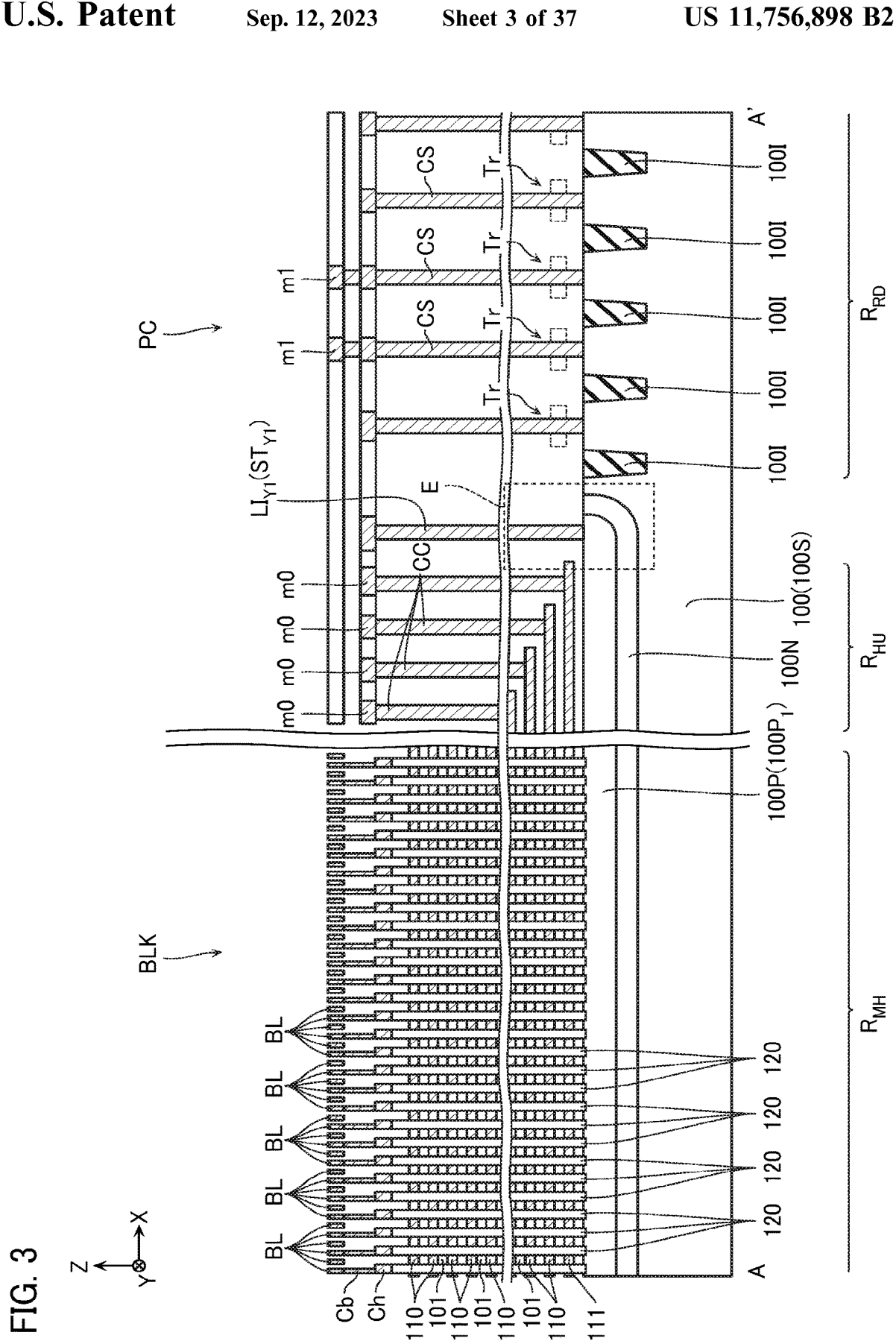
FIG. 3 is a schematic cross-sectional view of the configuration illustrated in FIG. 1 taken along a line A-A' viewed in a Y-direction.
Figure 4:
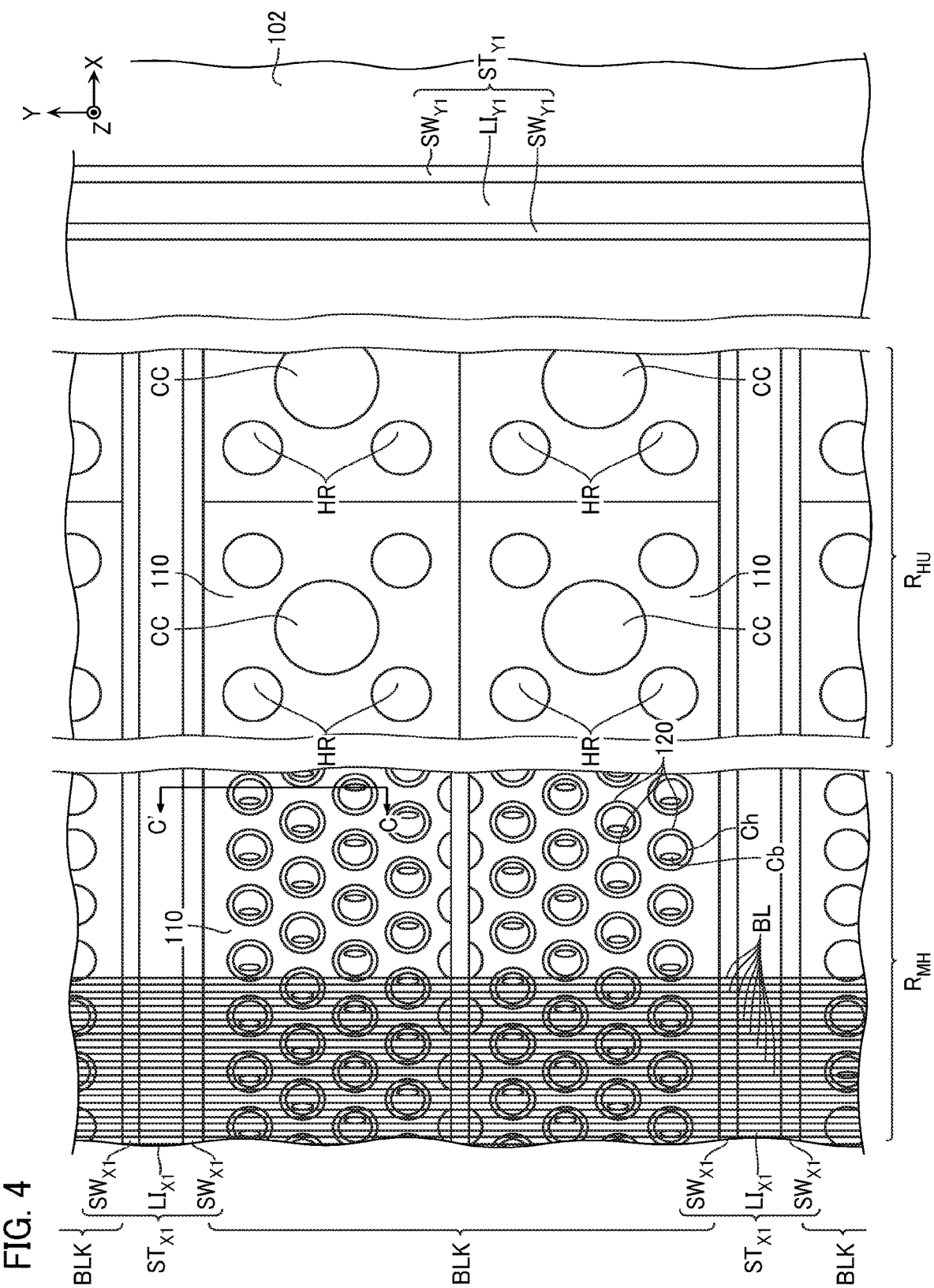
FIG. 4 is a schematic enlarged view of a part of FIG. 1.
Figure 5:
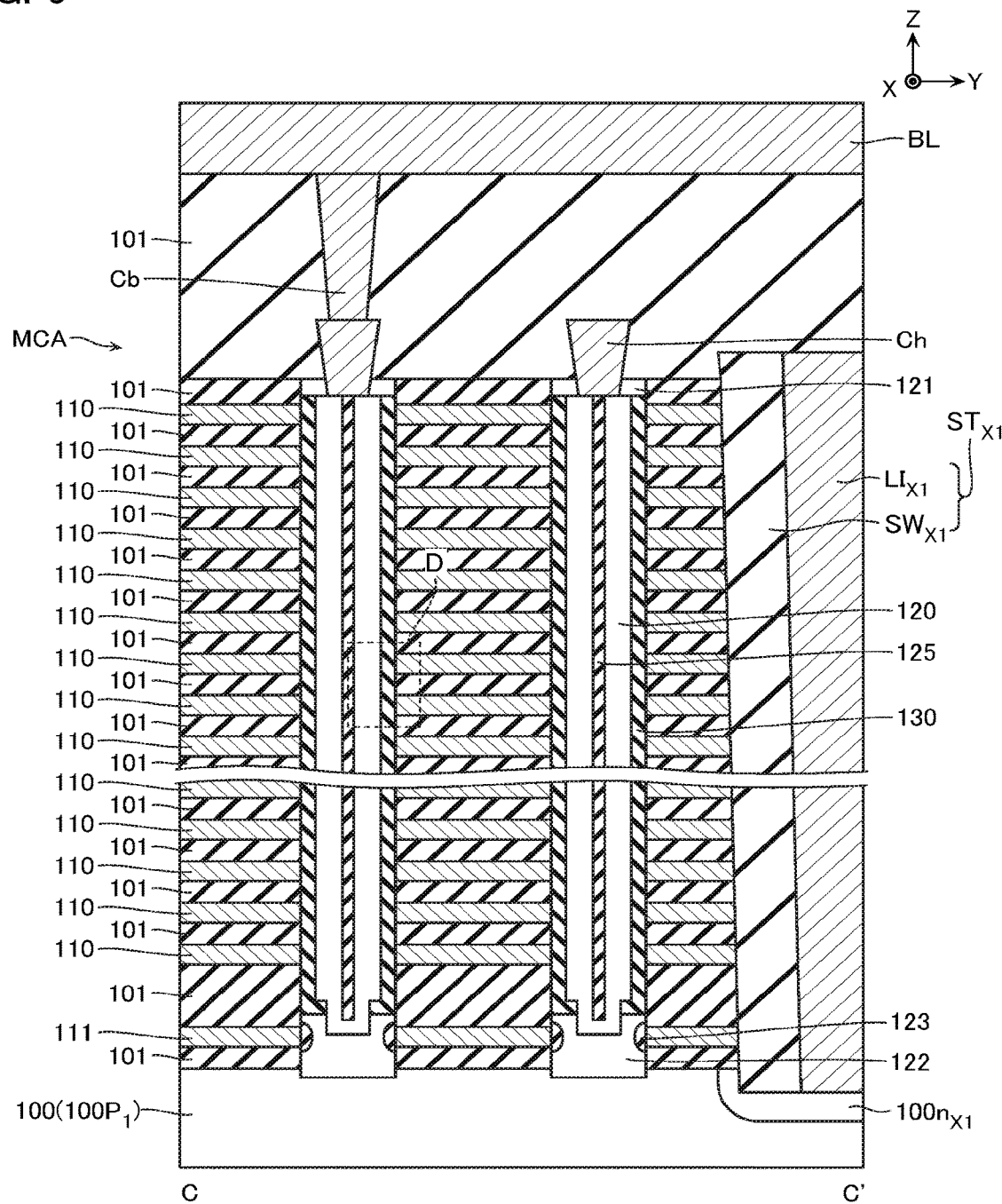
FIG. 5 is a schematic cross-sectional view of the structure illustrated in FIG. 4 taken along a line C-C' viewed in an X-direction.
Figure 6:
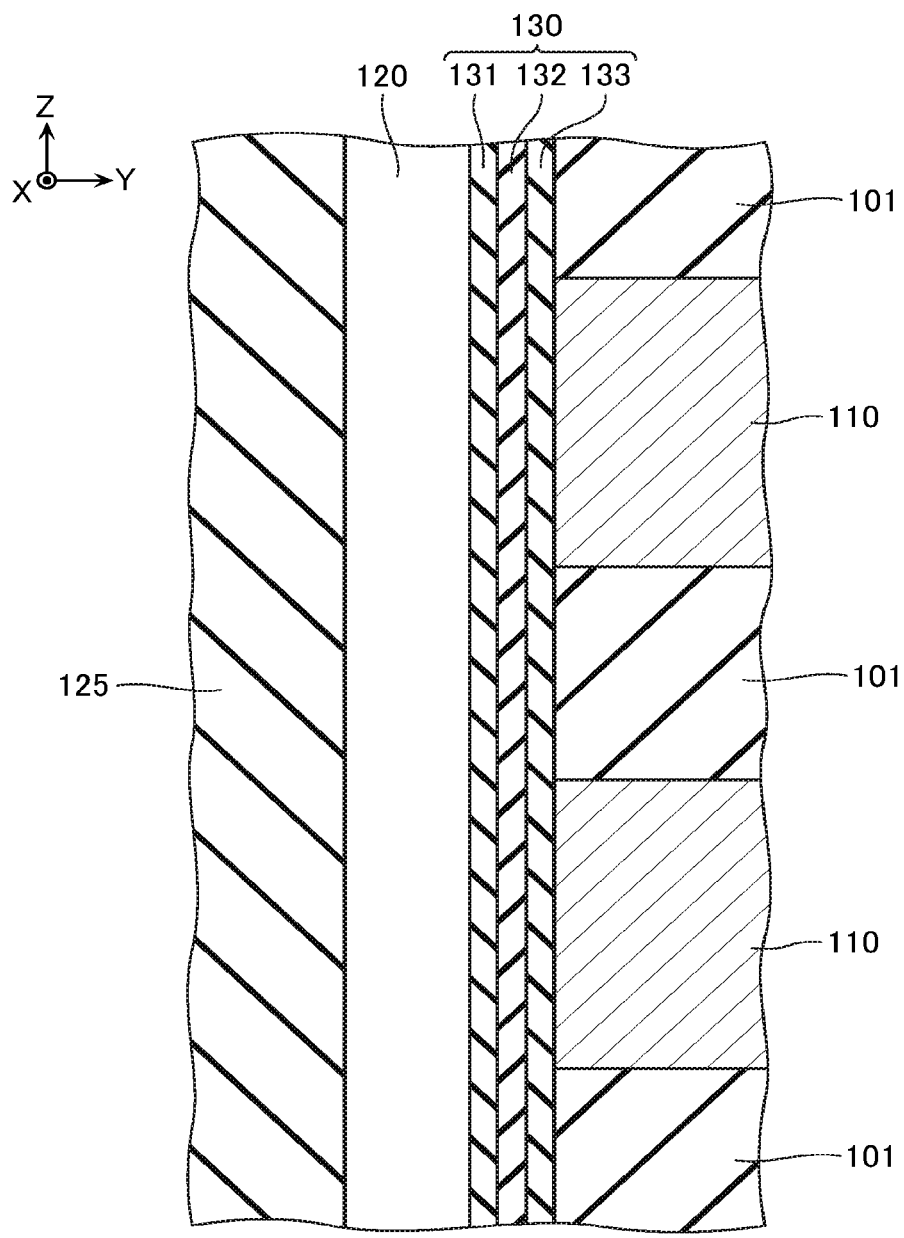
FIG. 6 is a schematic enlarged view of a part indicated as D in FIG. 5.
Figure 7:
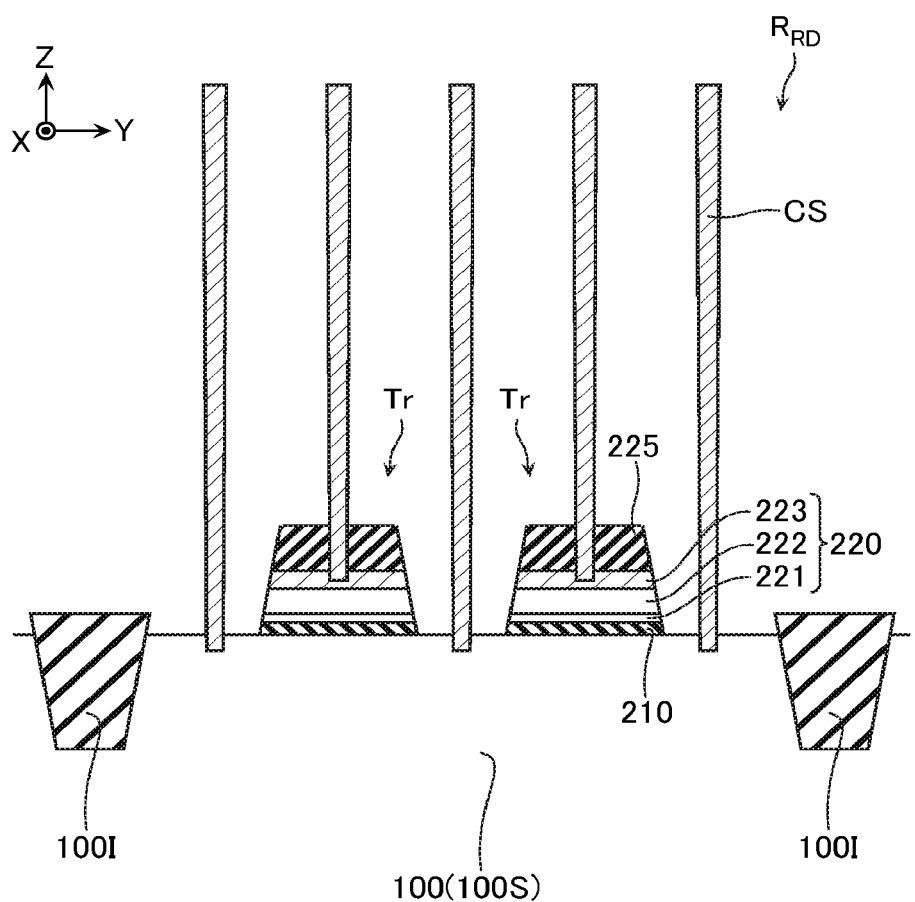
FIG. 7 is a schematic cross-sectional view illustrating a configuration of a transistor Tr disposed in a row decoder region $R_{RD}$.
Figure 8:
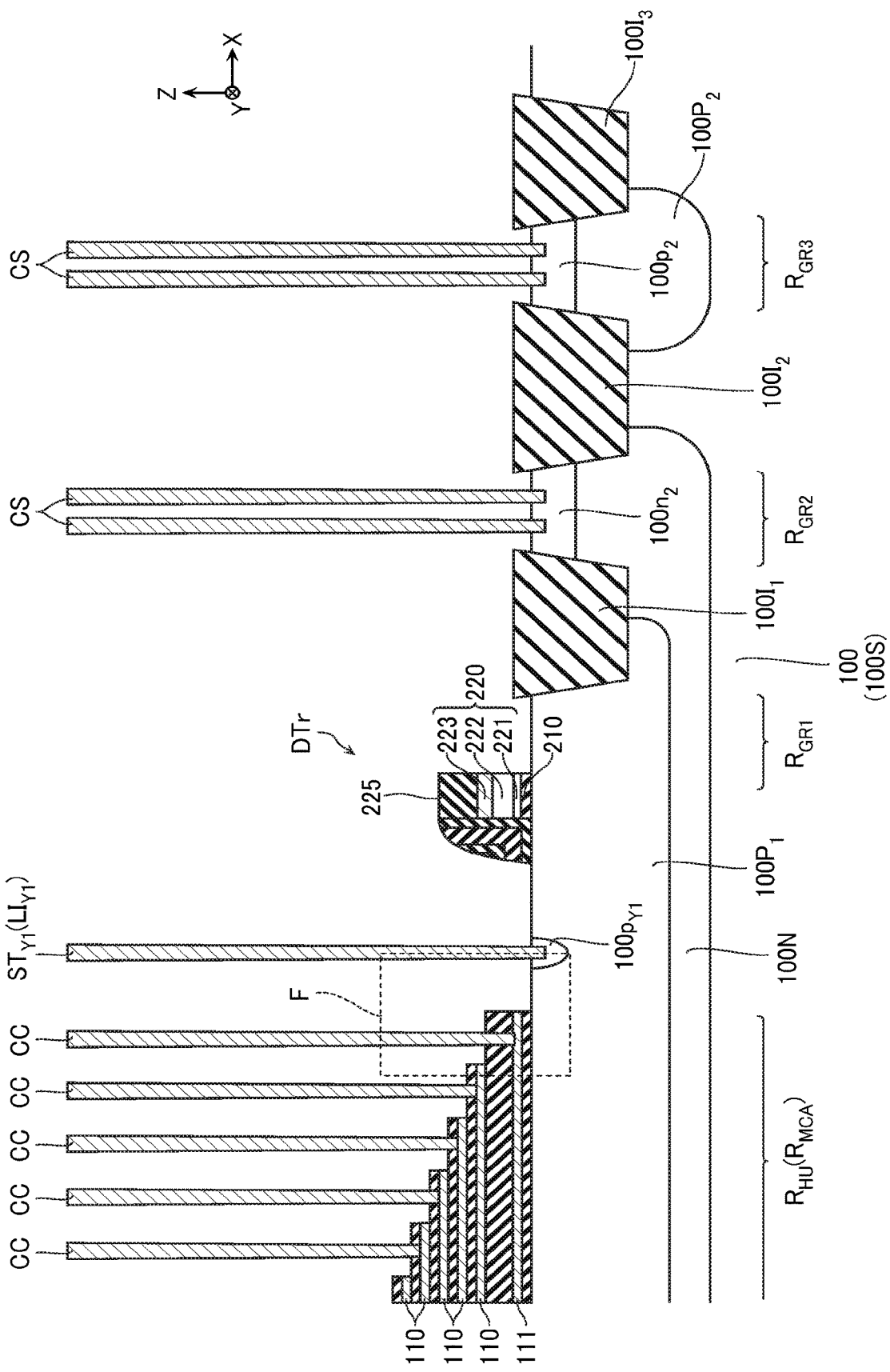
FIG. 8 is a schematic enlarged view of a part indicated as E in FIG. 3.
Figure 9:
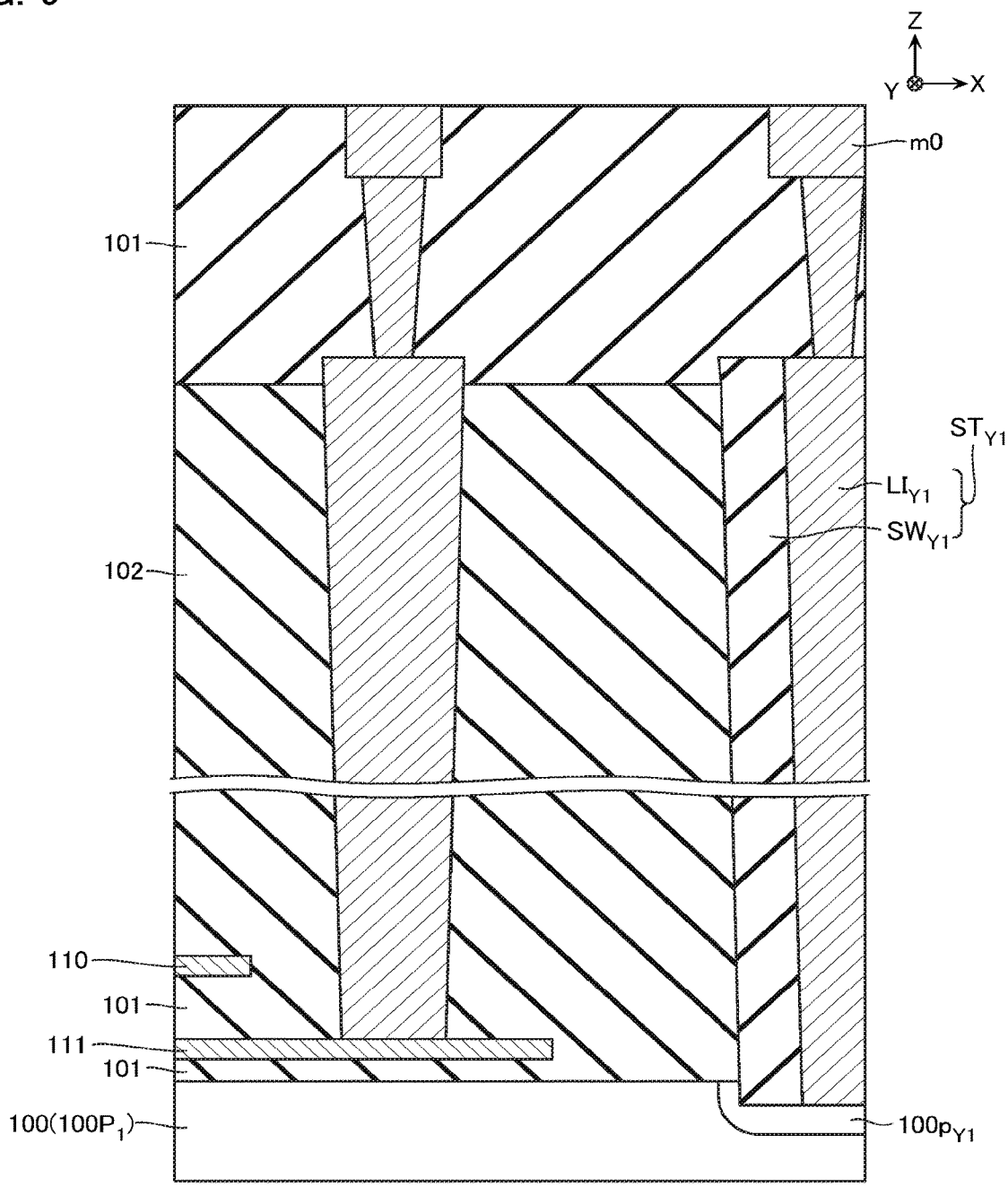
FIG. 9 is a schematic enlarged view including a part indicated as F in FIG. 8.
Figure 10:
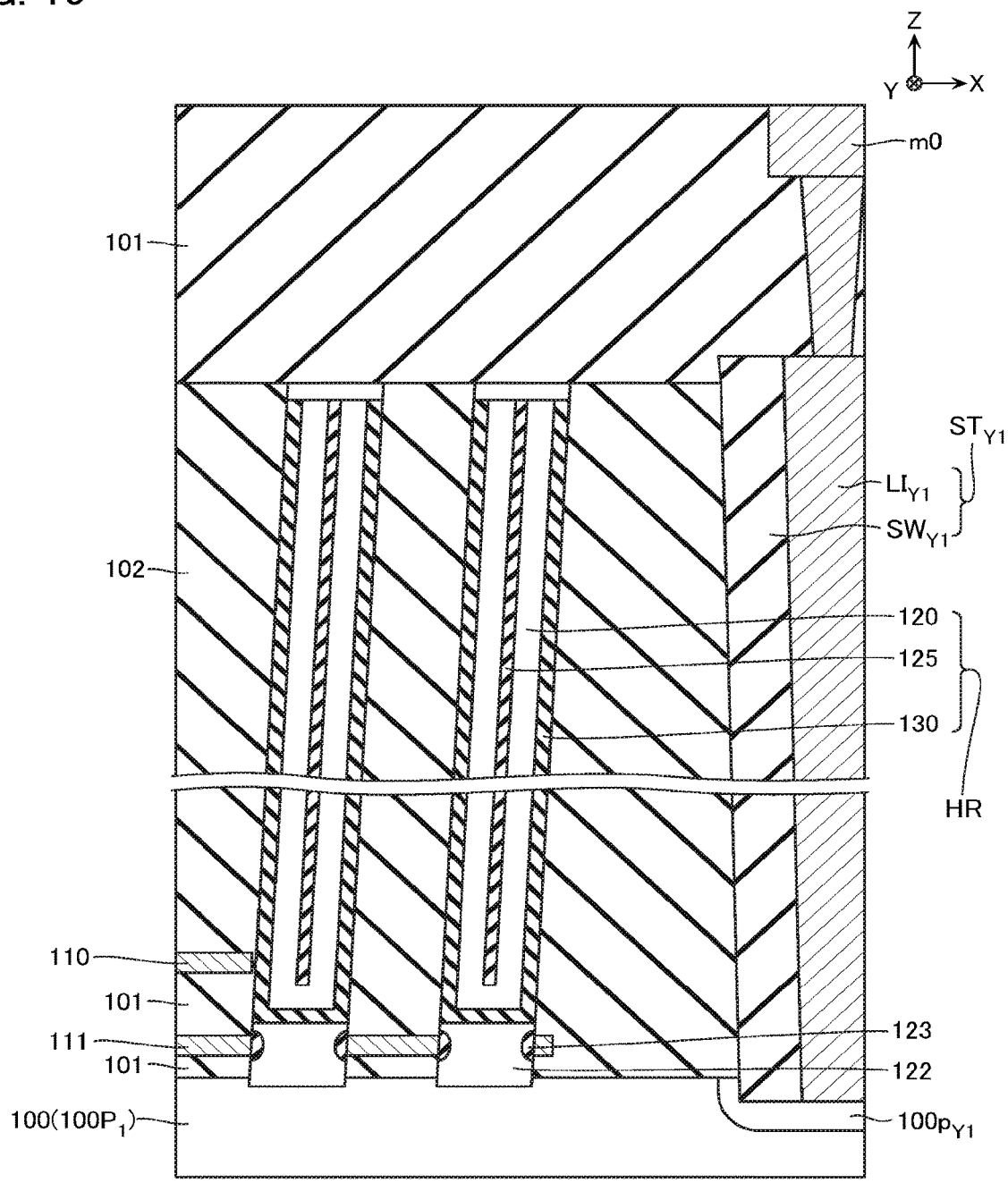
FIG. 10 is a schematic cross-sectional view illustrating a configuration of a part of a hook-up region $R_{HU}$.

Next, configurations included in the semiconductor memory device according to the embodiment will be described with reference to FIG. 3 to FIG. 10. FIG. 3 is a schematic cross-sectional view of the configuration illustrated in FIG. 1 taken along a line A-A' viewed in the Y-direction. FIG. 4 is a schematic enlarged view of a part of FIG. 1. FIG. 5 is a schematic cross-sectional view of the structure illustrated in FIG. 4 taken along a line C-C' viewed in the X-direction. FIG. 6 is a schematic enlarged view of a part indicated as D in FIG. 5. FIG. 7 is a schematic cross-sectional view illustrating a configuration of a transistor Tr disposed in the row decoder region $R_{RD}$. FIG. 8 is a schematic enlarged view of apart indicated as E in FIG. 3. FIG. 9 is a schematic enlarged view including a part indicated as F in FIG. 8. FIG. 10 is a schematic cross-sectional view illustrating a configuration of a part of the hook-up region $R_{HU}$.

[Structure of Semiconductor Substrate 100]

The semiconductor substrate 100 (FIG. 3) is, for example, a semiconductor substrate of P-type silicon (Si) containing P-type impurities, such as boron (B). For example, as illustrated in FIG. 3, in the surface of the semiconductor substrate 100, an N-type well region 100N containing N-type impurities, such as phosphorus (P), a P-type well region 100P containing P-type impurities, such as boron (B), a semiconductor substrate region 100S where the N-type well region 100N or the P-type well region 100P is not disposed, and insulating regions 100I are disposed. In the illustrated example, the P-type well region 100P (hereinafter referred to as a "P-type well region $100P_1$") is disposed in the memory cell array region $R_{MCA}$, and the N-type well region 100N is disposed between this P-type well region $100P_1$ and the semiconductor substrate region 100S. The semiconductor substrate region 100S is disposed in the row decoder region $R_{RD}$.

[Structure of Memory Block BLK in Memory Hole Region $R_{MH}$]

the memory hole region $R_{MH}$ of the memory block BLK includes a plurality of conductive layers 110 arranged in the Z-direction, a plurality of semiconductor layers 120 extending in the Z-direction, and a plurality of gate insulating films 130 (FIG. 5). The respective plurality of gate insulating films 130 are disposed between the plurality of conductive layers 110 and the plurality of semiconductor layers 120.

The conductive layer 110 is an approximately plate-shaped conductive layer extending in the X-direction. The conductive layer 110 may include, for example, a stacked film of a barrier conductive film, such as titanium nitride (TiN), and a metal film, such as tungsten (W). The conductive layer 110 may contain, for example, polycrystalline silicon containing impurities, such as phosphorus (P) or boron (B). Between the plurality of conductive layers 110 arranged in the Z-direction, insulating layers 101, such as silicon oxide ($SiO_2$), are disposed. A part of the plurality of conductive layers 110 function as gate electrodes of word lines and a plurality of memory cells connected thereto. A part of the plurality of conductive layers 110 function as gate electrodes of select gate lines and select gate transistors connected thereto.

A conductive layer 111 is disposed below the conductive layers 110. The conductive layer 111 may include, for example, a stacked film of a barrier conductive film, such as titanium nitride (TiN), and a metal film, such as tungsten (W). Between the conductive layer 111 and the conductive layer 110, the insulating layer 101, such as silicon oxide ($SiO_2$), is disposed. The conductive layer 111 functions as gate electrodes of select gate lines and select gate transistors connected thereto.

For example, as illustrated in FIG. 4, the semiconductor layers 120 are arranged in the X-direction and the Y-direction in a predetermined pattern. The semiconductor layers 120 function as channel regions of the plurality of memory cells and the select gate transistors arranged in the Z-direction. The semiconductor layer 120 is a semiconductor layer of polycrystalline silicon (Si) or the like. For example, as illustrated in FIG. 5, the semiconductor layer 120 has an approximately closed-bottomed cylindrical shape, and includes an insulating layer 125 of silicon oxide or the like in the center portion. Outer peripheral surfaces of the semiconductor layers 120 are each surrounded by the conductive layers 110, and opposed to the conductive layers 110.

An impurity region 121 containing N-type impurities, such as phosphorus (P), is disposed in an upper end portion of the semiconductor layer 120. The impurity regions 121 are each connected to the plurality of bit lines BL arranged in the X-direction via a contact Ch and a contact Cb (see FIG. 4).

A lower end portion of the semiconductor layer 120 is connected to the P-type well region $100P_1$ of the semiconductor substrate 100 via a semiconductor layer 122 formed of single-crystal silicon (Si) or the like. The semiconductor layer 122 functions as a channel region of the select gate transistor. An outer peripheral surface of the semiconductor layer 122 is surrounded by the conductive layer 111, and opposed to the conductive layer 111. An insulating layer 123 of silicon oxide or the like is disposed between the semiconductor layer 122 and the conductive layer 111.

The gate insulating film 130 has an approximately cylindrical shape that covers the outer peripheral surface of the semiconductor layer 120.

For example, as illustrated in FIG. 6, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are insulating films of silicon oxide ($SiO_2$) or the like. The electric charge accumulating film 132 is a film of silicon nitride ($Si_3N_4$) or the like and can accumulate electric charge. The tunnel insulating film 131, the electric charge accumulating film 132, and the block insulating film 133 have approximately cylindrical shapes, and extend in the Z-direction along the outer peripheral surface of the semiconductor layer 120.

FIG. 6 illustrates an example where the gate insulating film 130 includes the electric charge accumulating film 132 of silicon nitride or the like. However, the gate insulating film 130 may include, for example, a floating gate of polycrystalline silicon containing N-type or P-type impurities.

[Structure of Memory Block BLK in Hook-Up Region $R_{HU}$]

For example, as illustrated in FIG. 3, the hook-up region $R_{HU}$ of the memory block BLK includes end portions in the X-direction of the plurality of conductive layers 110. These plurality of end portions are mutually different in positions in the X-direction or positions in the Y-direction. Therefore, the end portion in the X-direction of the memory block BLK has an approximately staircase-shaped structure.

For example, as illustrated in FIG. 4, the hook-up region $R_{HU}$ includes a plurality of contacts CC arranged in the X-direction and the Y-direction in a matrix. As illustrated in FIG. 3, the plurality of contacts CC extend in the Z-direction and have lower ends connected to the conductive layers 110. The plurality of contacts CC have upper ends connected to a plurality of wirings m0, m1 (FIG. 3) disposed above. The contact CC may include, for example, a stacked film of a barrier conductive film, such as titanium nitride (TiN), and a metal film, such as tungsten (W).

As illustrated in FIG. 4, the hook-up region $R_{HU}$ includes supporting structures HR disposed at the proximities of the contacts CC. Outer peripheral surfaces of the supporting structures HR are each surrounded by the conductive layers 110 and connected to the conductive layers 110. For example, as illustrated in FIG. 10, the supporting structure HR may include the semiconductor layer 120, the insulating layer 125, and the gate insulating film 130. The supporting structure HR may include an insulating layer of silicon oxide ($SiO_2$) or the like formed in an approximately columnar shape instead of these structures. The supporting structure HR according to the embodiment may be inclined to the row decoder region $R_{RD}$ side. That is, a position in the X-direction of an upper end of the supporting structure HR may be positioned at the row decoder region $R_{RD}$ side with respect to a position in the X-direction of a lower end of the supporting structure HR. A magnitude (difference in the X-direction between the upper end position and the lower end position) of such an inclination may be greater than those of the semiconductor layer 120 (FIG. 3) and the contact CC (FIG. 3) disposed in the memory hole region $R_{MH}$.

[Structure of Inter-Block Structure $ST_{X1}$]

The inter-block structure $ST_{X1}$ includes, for example, as illustrated in FIG. 4 and FIG. 5, a conductive layer $LI_{X1}$ extending in the Z-direction and the X-direction, and an insulating layer $SW_{X1}$ of silicon oxide ($SiO_2$) or the like disposed on both side surfaces in the Y-direction of the conductive layer $LI_{X1}$. A lower end of the conductive layer $LI_{X1}$ is positioned below the plurality of conductive layers 110 and the conductive layer 111, and connected to an N-type impurity region $100n_{X1}$ disposed in the P-type well region $100P_1$ of the semiconductor substrate 100. The impurity region $100n_{X1}$ extends in the X-direction along the inter-block structure $ST_{X1}$, and contains N-type impurities, such as phosphorus (P). An upper end of the conductive layer $LI_{X1}$ is positioned above the plurality of conductive layers 110 and below the plurality of bit lines BL, and connected to the wiring m0 extending in the Y-direction. The conductive layer $LI_{X1}$ may include, for example, a stacked film of a barrier conductive film, such as titanium nitride (TiN), and a metal film, such as tungsten (W), may include such a stacked film and a semiconductor layer of polycrystalline silicon or the like, or may include a semiconductor layer of polycrystalline silicon or the like and silicide or the like. The conductive layer $LI_{X1}$ functions as, for example, apart of the source line. That is, when a voltage is supplied to the conductive layer 111, a channel (inversion layer) of electrons is formed in the P-type well region $100P_1$, thereby electrically conducting the semiconductor layer 120 to the conductive layer $LI_{X1}$. A length in the X-direction of the inter-block structure $ST_{X1}$ may be greater than a length in the X-direction of the memory block BLK.

[Structure of Row Decoder Region $R_{RD}$ and Peripheral Circuit Region $R_{PC}$]

The row decoder region $R_{RD}$ (FIG. 1) includes a row decoder that transfers a voltage to the conductive layers 110 and the conductive layer 111. The peripheral circuit region $R_{PC}$ (FIG. 1) includes other circuits that supply voltages to the memory block BLK and the like.

For example, as illustrated in FIG. 7, the row decoder region $R_{RD}$ and the peripheral circuit region $R_{PC}$ of the semiconductor substrate 100 include gate insulating films 210, gate electrodes 220, and contacts CS connected to the semiconductor substrate 100 and the gate electrode 220.

In the row decoder region $R_{RD}$, the semiconductor substrate region 100S of the semiconductor substrate 100 functions as channel regions and the like of a plurality of transistors Tr constituting the peripheral circuit PC. In the peripheral circuit region $R_{PC}$, the N-type well region 100N, the P-type well region 100P, and the semiconductor substrate region 100S of the semiconductor substrate 100 each function as channel regions and the like of the plurality of transistors Tr constituting the peripheral circuit PC.

The gate insulating films 210 are disposed in the N-type well region 100N, the P-type well region 100P, and the semiconductor substrate region 100S of the semiconductor substrate 100. The gate insulating film 210 contains silicon oxide ($SiO_2$) or the like.

The gate electrode 220 includes, for example, semiconductor layers 221, 222 of polycrystalline silicon containing impurities, such as phosphorus (P) or boron (B), or the like and a conductive layer 223 of tungsten (W) or the like. An insulating layer 225 of silicon nitride (SiN) or the like is disposed on an upper surface of the gate electrode 220.

The contact CS extends in the Z-direction and has a lower end connected to the semiconductor substrate 100 or the upper surface of the gate electrode 220. As illustrated in FIG. 3, the contact CS has an upper end connected to the plurality of wirings m0, m1 disposed above. The contact CS may include, for example, a stacked film of a barrier conductive film, such as titanium nitride (TiN), and a metal film, such as tungsten (W).

[Structure of Region between Memory Cell Array Region $R_{MCA}$ and Row Decoder Region $R_{RD}$]

As illustrated in FIG. 8, in a region between the memory cell array region $R_{MCA}$ and the row decoder region $R_{RD}$, a guard ring region $R_{GR1}$, an insulating region $100I_1$, a guard ring region $R_{GR2}$, an insulating region $100I_2$, a guard ring region $R_{GR3}$, and an insulating region $100I_3$ are disposed in this order from the memory cell array region $R_{MCA}$ side.

The guard ring region $R_{GR1}$ is disposed in the P-type well region $100P_1$ in common with the memory cell array region $R_{MCA}$, and formed to surround the memory cell array region $R_{MCA}$ in the surface of the semiconductor substrate 100. The insulating region $100I_1$ is disposed between the guard ring region $R_{GR1}$ and the guard ring region $R_{GR2}$, and formed to surround the guard ring region $R_{GR1}$ in the surface of the semiconductor substrate 100.

The guard ring region $R_{GR2}$ is disposed in the N-type well region 100N between the P-type well region $100P_1$ and the semiconductor substrate region 100S, and formed to surround the insulating region $100I_1$ in the surface of the semiconductor substrate 100. In the guard ring region $R_{GR2}$, an impurity region $100n_2$ containing N-type impurities, such as phosphorus (P), is disposed in the surface of the semiconductor substrate 100. In the guard ring region $R_{GR2}$, a plurality of contacts CS are disposed along this impurity region $100n_2$. The plurality of contacts CS supply a well voltage to the N-type well region 100N. The insulating region $100I_2$ is disposed between the guard ring region $R_{GR2}$ and the guard ring region $R_{GR3}$, and formed to surround the guard ring region $R_{GR2}$ in the surface of the semiconductor substrate 100.

The guard ring region $R_{GR3}$ is disposed in a P-type well region $100P_2$ disposed separately from the P-type well region $100P_1$, and formed to surround the insulating region $100I_2$ in the surface of the semiconductor substrate 100. In the guard ring region $R_{GR3}$, an impurity region $100p_2$ containing P-type impurities, such as boron (B), is disposed in the surface of the semiconductor substrate 100. In the guard ring region $R_{GR3}$, a plurality of contacts CS are disposed along this impurity region $100p_2$. The plurality of contacts CS supply a well voltage to the P-type well region $100P_2$.

Between the guard ring region $R_{GR1}$ and the memory cell array region $R_{MCA}$, a dummy transistor structure DTr and a block side structure $ST_{Y1}$ are disposed. The dummy transistor structure DTr includes the gate insulating film 210, the gate electrode 220, and the insulating layer 225 included in the transistor Tr. However, these configurations do not function as the transistor Tr. The block side structure $ST_{Y1}$ is disposed at the memory cell array region $R_{MCA}$ side with respect to the dummy transistor structure DTr.

[Structure of Block Side Structure $ST_{Y1}$]

For example, as illustrated in FIG. 4 and FIG. 9, the block side structure $ST_{Y1}$ includes a conductive layer $LI_{Y1}$ extending in the Z-direction and the Y-direction, and insulating layers $SW_{Y1}$ of silicon oxide ($SiO_2$) or the like disposed on both side surfaces in the X-direction of the conductive layer $LI_{Y1}$. A lower end of the conductive layer $LI_{Y1}$ is positioned below the plurality of conductive layers 110 and the conductive layer 111, and connected to a P-type impurity region $100p_{Y1}$ disposed in the P-type well region $100P_1$ of the semiconductor substrate 100. The impurity region $100p_{Y1}$ extends in the Y-direction along the block side structure $ST_{Y1}$, and contains P-type impurities, such as boron (B). An upper end of the conductive layer $LI_{Y1}$ is positioned above the plurality of conductive layers 110 and below the plurality of bit lines BL, and connected to the wiring m0. The conductive layer $LI_{Y1}$ may include, for example, a stacked film of a barrier conductive film, such as titanium nitride (TiN), and a metal film, such as tungsten (W), may include such a stacked film and a semiconductor layer of polycrystalline silicon or the like, or may include a semiconductor layer of polycrystalline silicon or the like and silicide or the like. The conductive layer $LI_{Y1}$ may function as, for example, a wiring that supplies a ground voltage to the P-type well region $100P_1$. That is, the conductive layer $LI_{Y1}$ may be electrically connected to an external terminal (not illustrated), to which the ground voltage is supplied, of the semiconductor memory device. The block side structure $ST_{Y1}$ is disposed at a position separated from the memory block BLK and the inter-block structure $ST_{X1}$ in the X-direction. In the example of FIG. 1, the length in the Y-direction of the block side structure $ST_{Y1}$ matches the width in the Y-direction of the memory cell array region $R_{MCA}$. However, the length in the Y-direction of the block side structure $ST_{Y1}$ may be greater than, or may be smaller than the width in the Y-direction of the memory cell array region $R_{MCA}$. In the example of FIG. 4, the width in the X-direction of the block side structure $ST_{Y1}$ matches the width in the Y-direction of the inter-block structure $ST_{X1}$. However, the width in the X-direction of the block side structure $ST_{Y1}$ may be greater than, or may be smaller than the width in the Y-direction of the inter-block structure $ST_{X1}$.

[Manufacturing Method]

Next, with reference to FIG. 11 to FIG. 21, the method for manufacturing the semiconductor memory device according to the first embodiment will be described. FIG. 11, FIG. 13 to FIG. 15, and FIG. 18 to FIG. 20 are schematic cross-sectional views for describing the manufacturing method, and illustrate configurations corresponding to that in FIG. 5. FIG. 12 is a schematic cross-sectional view for describing the manufacturing method, and illustrates a cross-sectional surface corresponding to that in FIG. 8. FIG. 16 and FIG. 21 are schematic cross-sectional views for describing the manufacturing method, and illustrate cross-sectional surfaces corresponding to that in FIG. 9. FIG. 17 is a schematic perspective view for describing the manufacturing method, and illustrates a configuration corresponding to that in FIG. 2.

In the manufacture of the semiconductor memory device according to the embodiment, first, a plurality of transistors Tr (FIG. 3) constituting the peripheral circuit PC are formed in the row decoder region $R_{RD}$ and the peripheral circuit region $R_{PC}$ of the semiconductor substrate 100.

Figure 11:
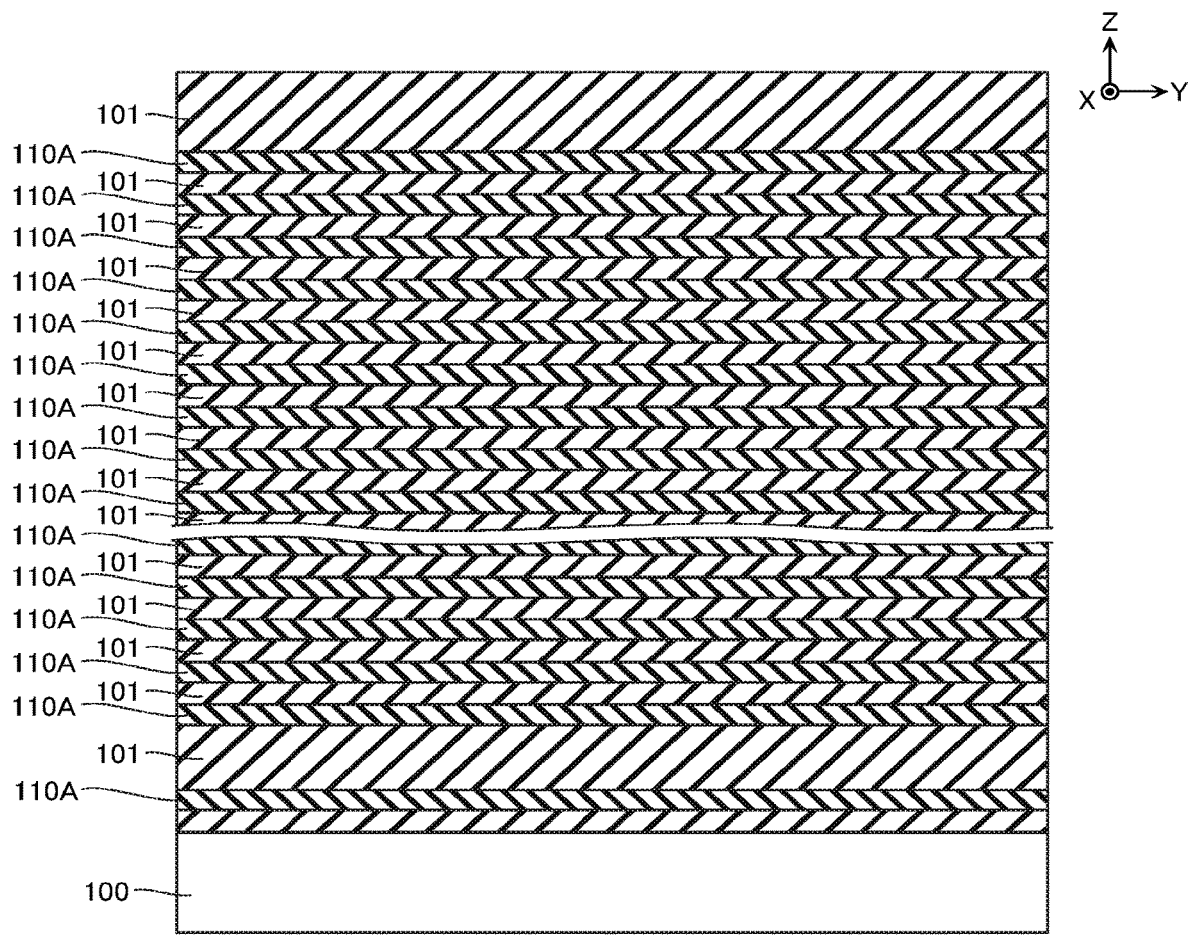
FIG. 11 is a schematic cross-sectional view for describing a method for manufacturing the semiconductor memory device according to the first embodiment.
Figure 12:
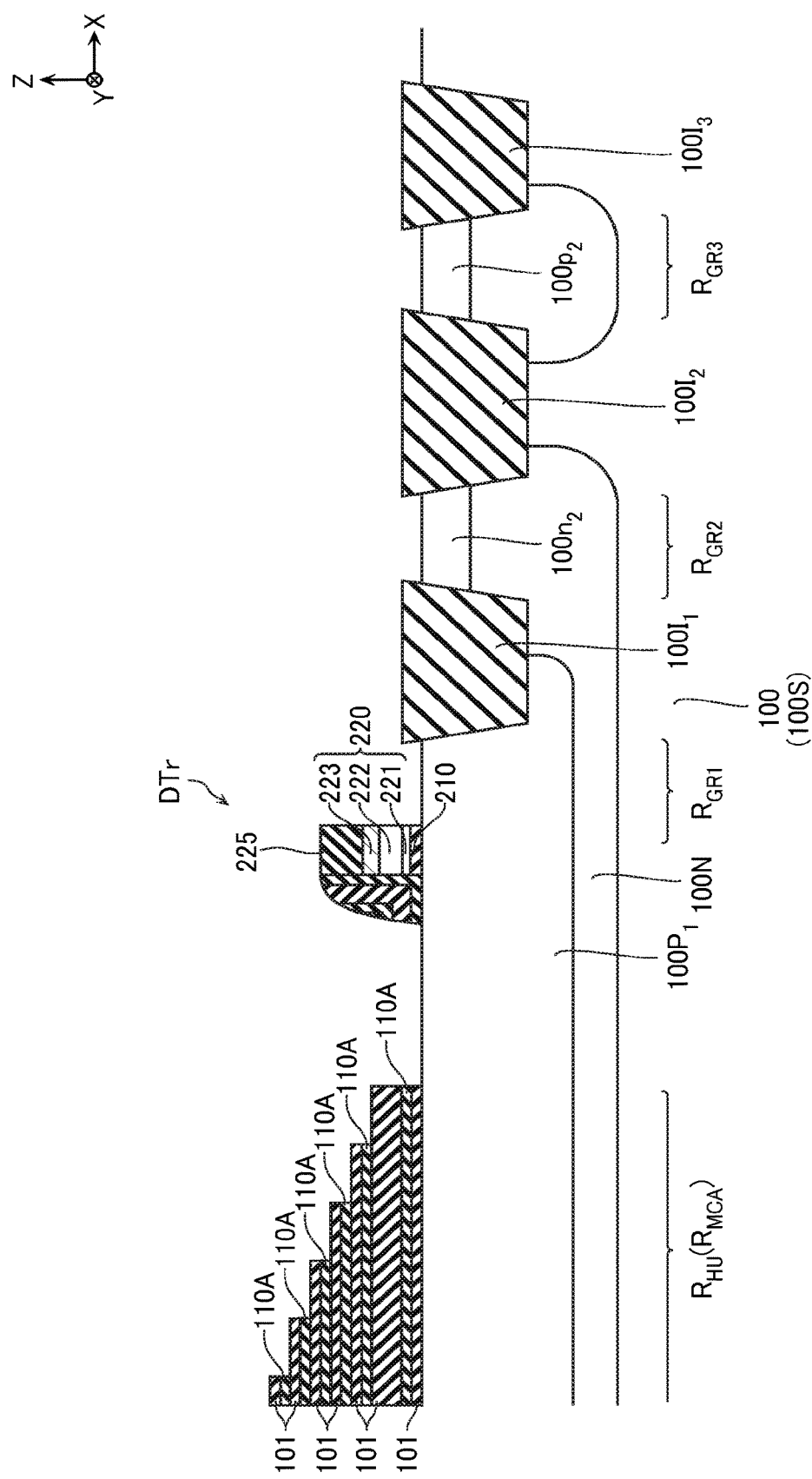
FIG. 12 is a schematic cross-sectional view illustrating the method for manufacturing the semiconductor memory device.

Next, for example, as illustrated in FIG. 11, a plurality of sacrifice layers 110A and insulating layers 101 are formed on the semiconductor substrate 100. The sacrifice layer 110A is formed of silicon nitride (SiN) or the like. This process is performed by a method, such as Chemical Vapor Deposition (CVD). The plurality of sacrifice layers 110A and insulating layers 101 are formed in the memory cell array region $R_{MCA}$ described with reference to FIG. 1.

Next, for example, as illustrated in FIG. 12, the plurality of sacrifice layers 110A and insulating layers 101 are partially removed to form an approximately staircase-shaped structure in the hook-up region $R_{HU}$. This process is performed by, for example, forming a resist on an upper surface of the structure described with reference to FIG. 11, and repeating removal of the insulating layers 101 by Reactive Ion Etching (RIE) or the like, removal of the sacrifice layers 110A by RIE or the like, and isotropic removal of the resist.

Next, an insulating layer 102 (see FIG. 9) that covers this staircase-shaped structure is formed. This process is performed by a method, such as CVD.

Figure 13:
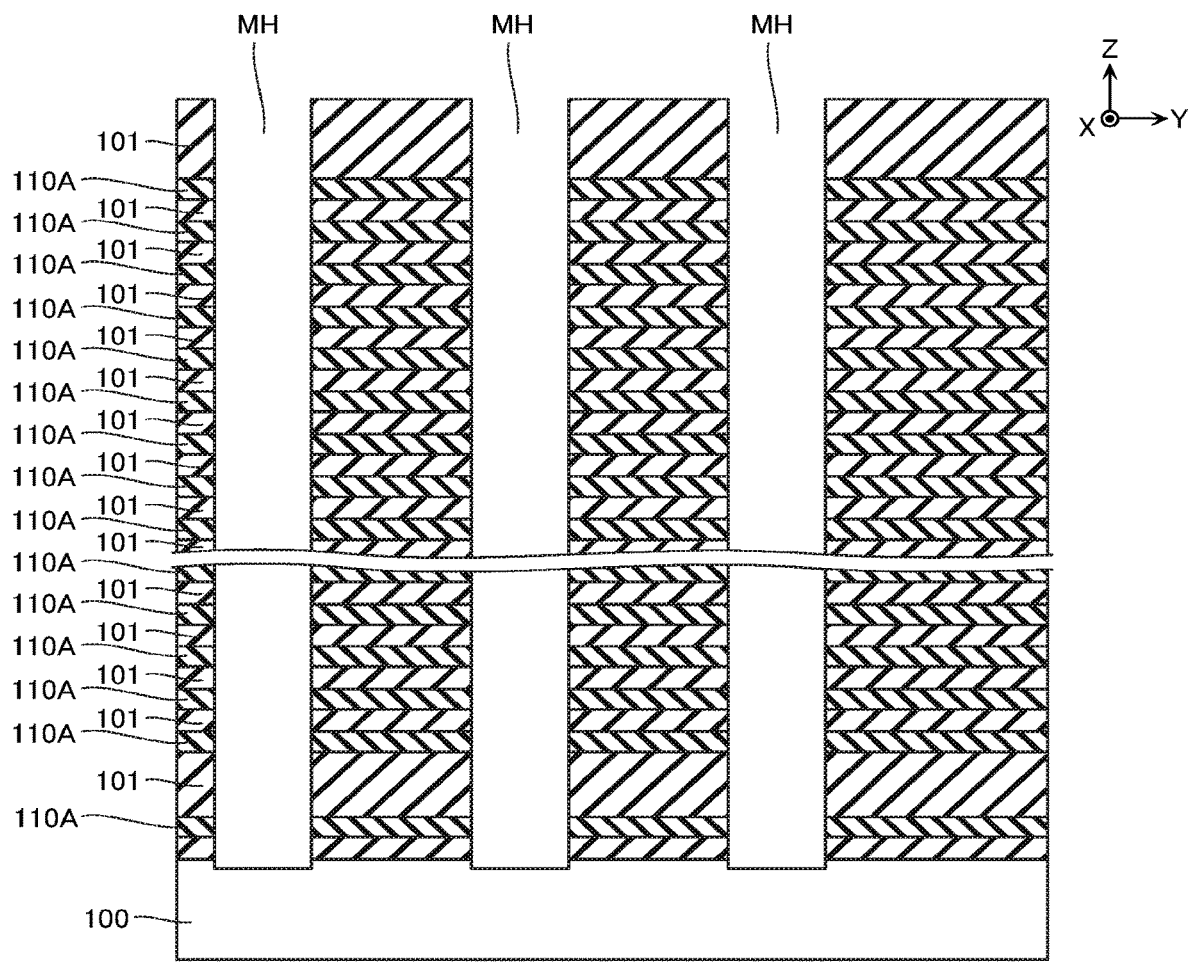
FIG. 13 is a schematic cross-sectional view illustrating the method for manufacturing the semiconductor memory device.

Next, for example, as illustrated in FIG. 13, a plurality of memory holes MH are formed at positions corresponding to the semiconductor layers 120 and positions corresponding to the supporting structures HR. The memory hole MH is a through hole that extends in the Z-direction and penetrates the insulating layers 101 and the sacrifice layers 110A to expose the upper surface of the semiconductor substrate 100. This process is performed by a method, such as RIE.

Figure 14:
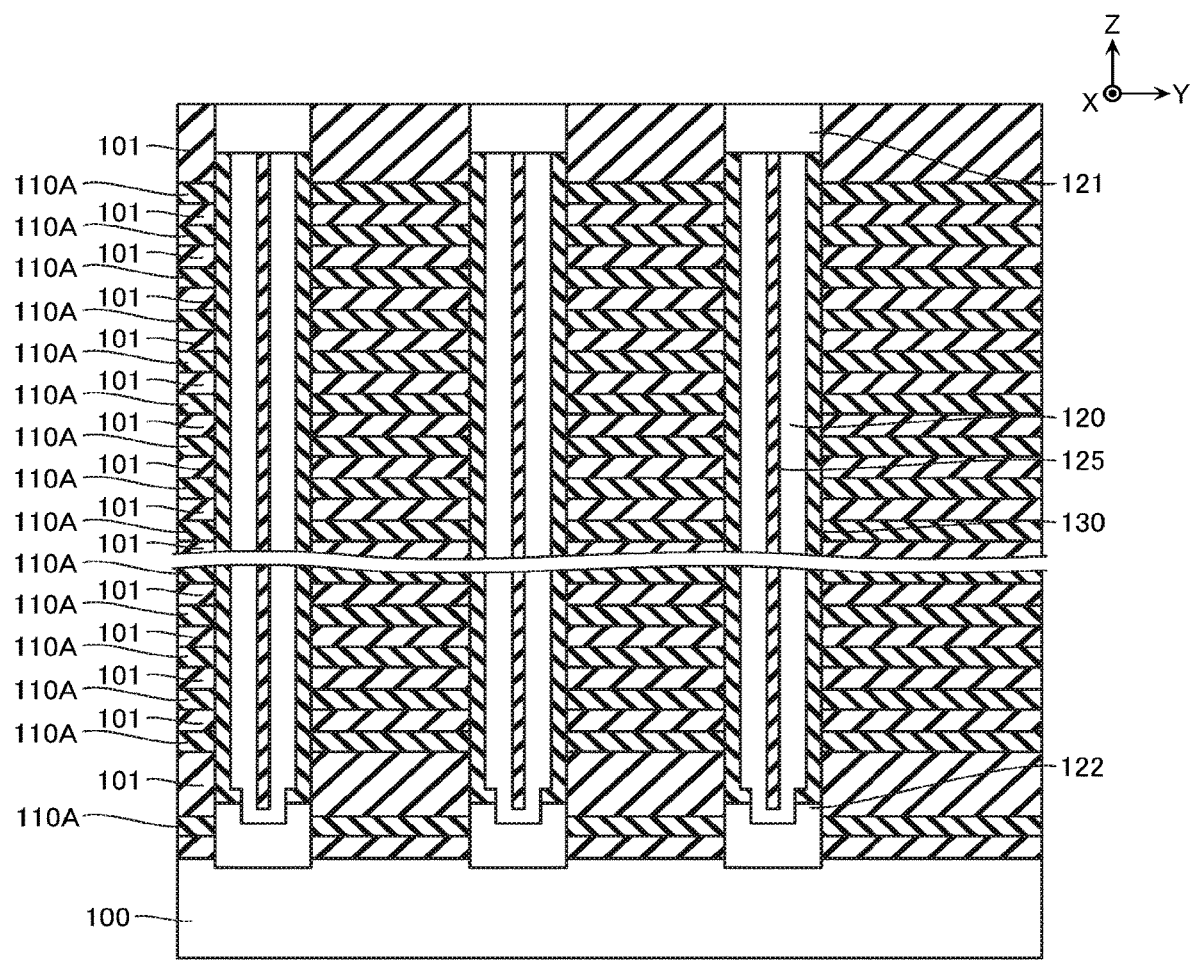
FIG. 14 is a schematic cross-sectional view illustrating the method for manufacturing the semiconductor memory device.

Next, for example, as illustrated in FIG. 14, the semiconductor layer 122, the gate insulating film 130, the semiconductor layer 120, and the insulating layer 125 are formed inside the memory hole MH. This process is performed by a method, such as epitaxial growth, CVD, and RIE.

Figure 15:
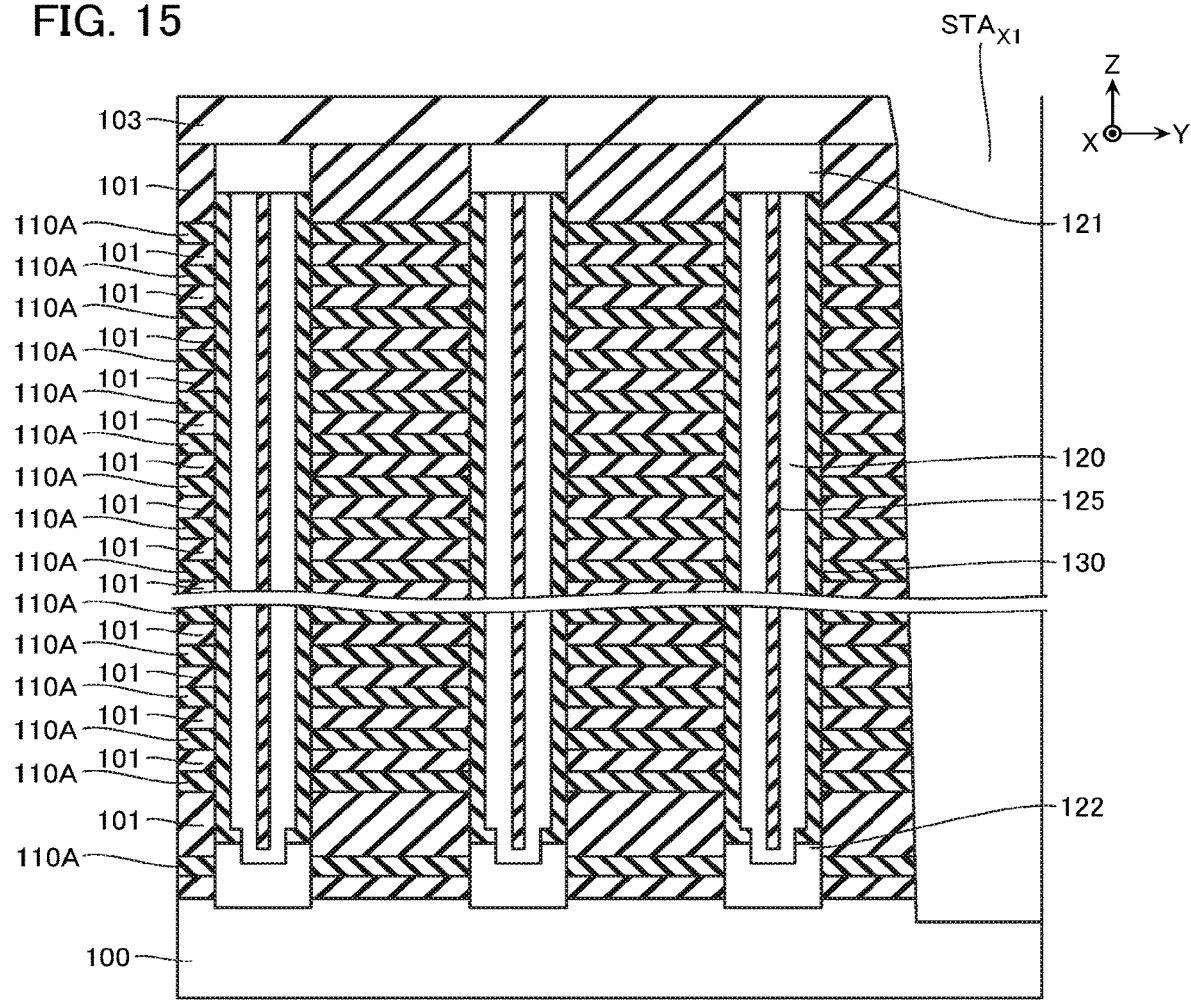
FIG. 15 is a schematic cross-sectional view illustrating the method for manufacturing the semiconductor memory device.
Figure 16:
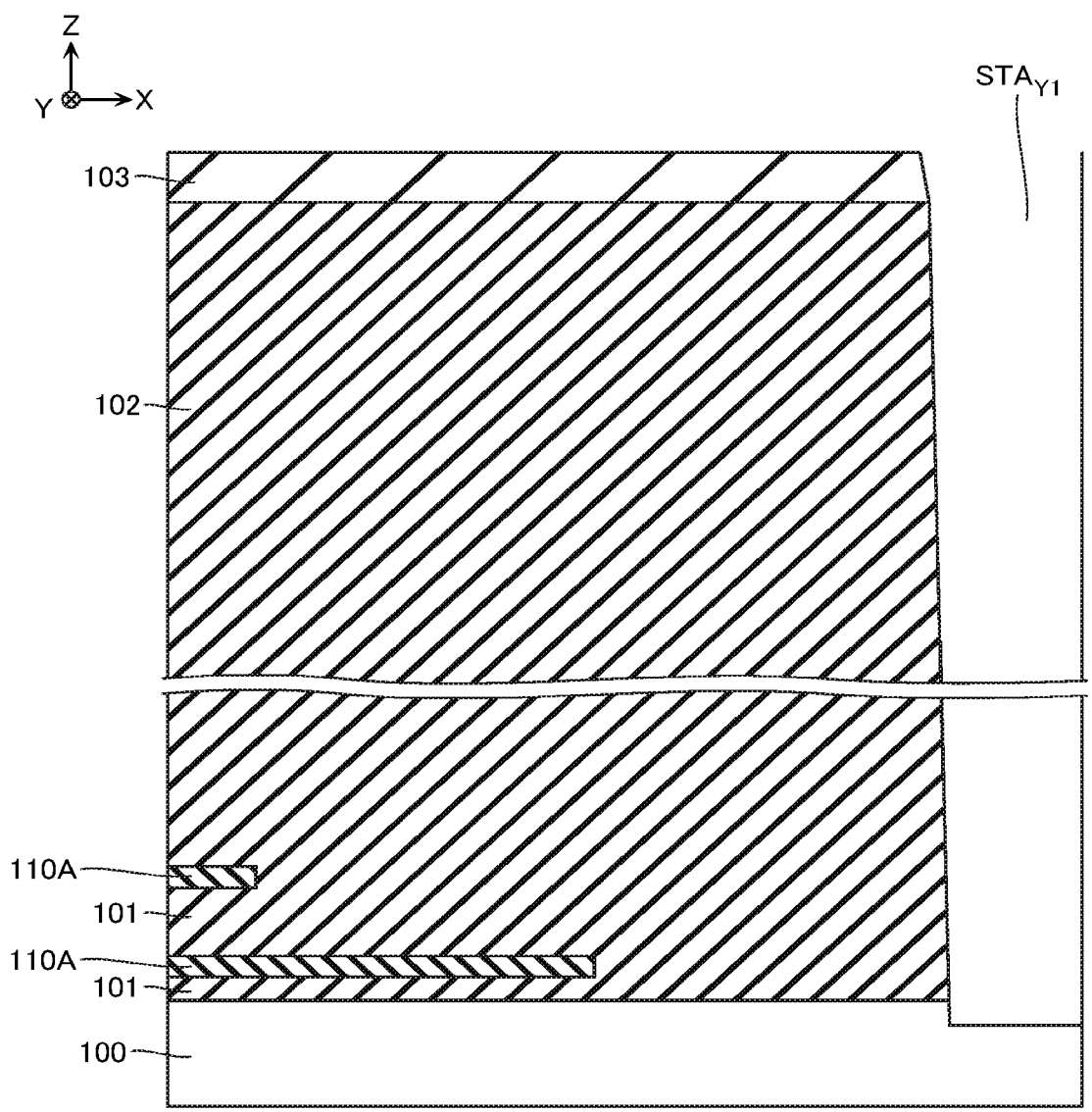
FIG. 16 is a schematic cross-sectional view illustrating the method for manufacturing the semiconductor memory device.
Figure 17:
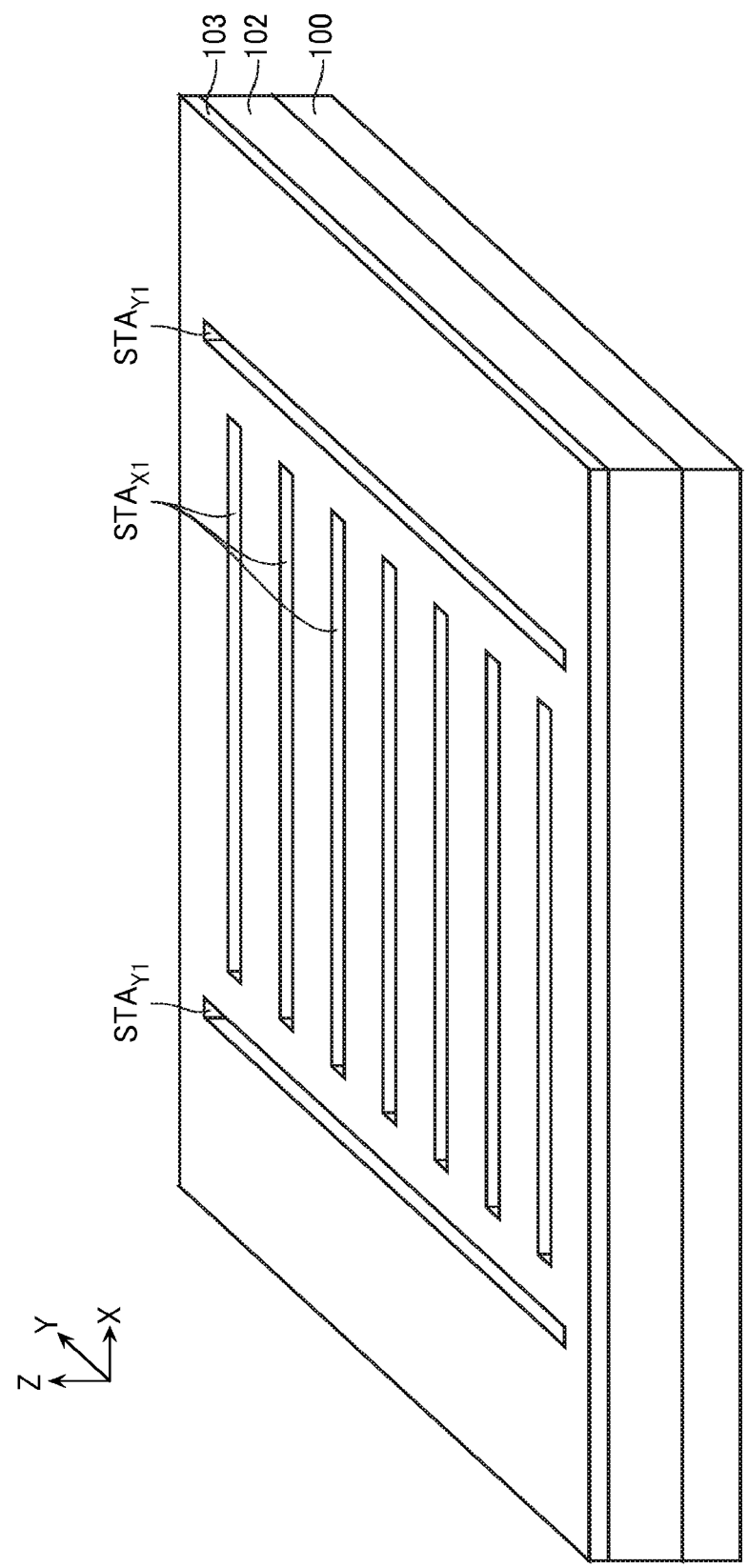
FIG. 17 is a schematic perspective view illustrating the method for manufacturing the semiconductor memory device.

Next, for example, as illustrated in FIG. 15 to FIG. 17, trenches $STA_{X1}$ are formed at positions corresponding to the inter-block structures $ST_{X1}$, and trenches $STA_{Y1}$ are formed at positions corresponding to the block side structures $ST_{Y1}$. The trench $STA_{X1}$ extends in the Z-direction and the X-direction, separates the insulating layers 101 and the sacrifice layers 110A in the Y-direction, and exposes the upper surface of the semiconductor substrate 100. The trench $STA_{Y1}$ extends in the Z-direction and the Y-direction, and exposes the upper surface of the semiconductor substrate 100. This process is performed by, for example, forming an insulating layer 103 of $SiO_2$ or the like on the upper surface of the structure described with reference to FIG. 14 and performing RIE or the like using this insulating layer 103 as a mask.

Figure 18:
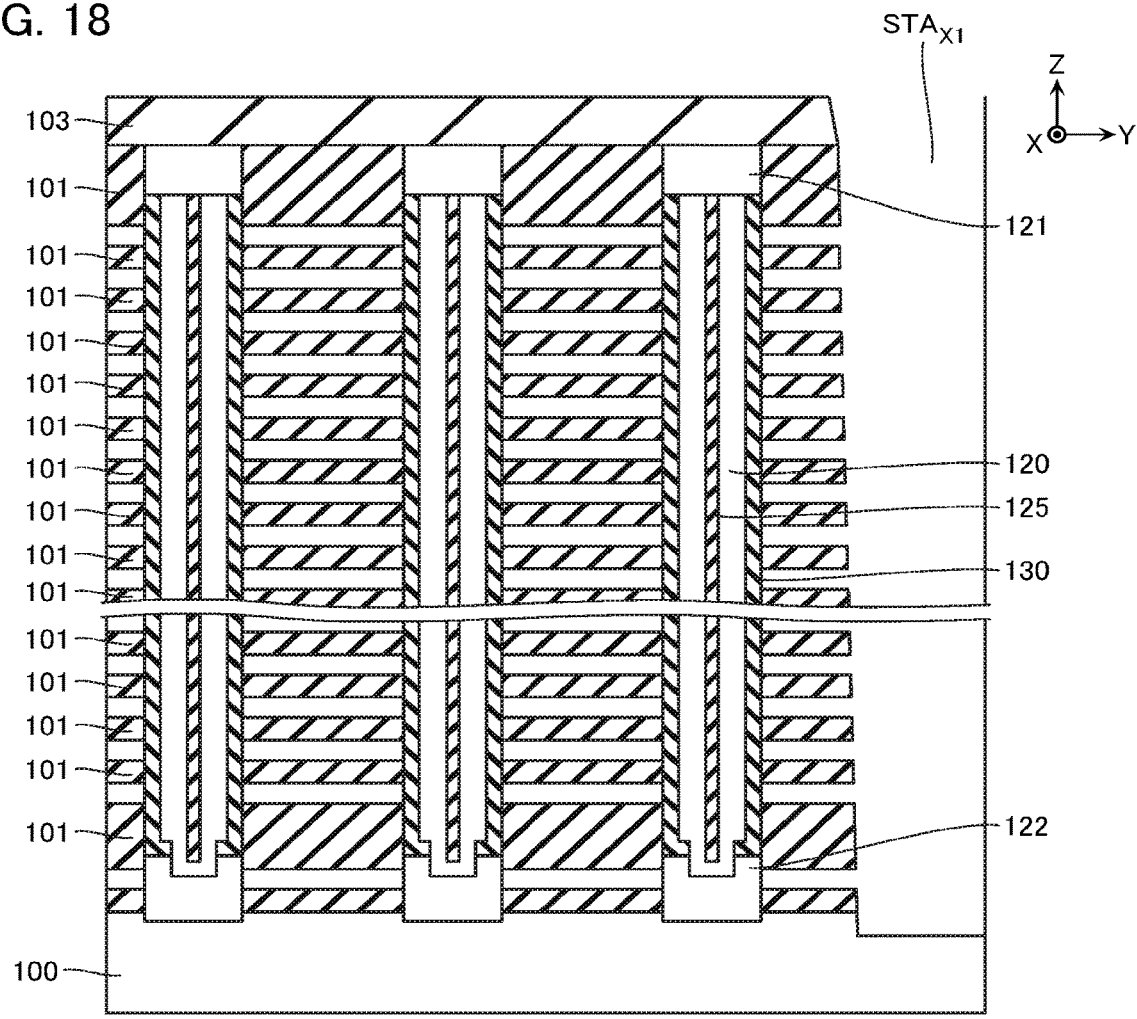
FIG. 18 is a schematic cross-sectional view illustrating the method for manufacturing the semiconductor memory device.

Next, for example, as illustrated in FIG. 18, the sacrifice layers 110A are removed via the trenches $STA_{X1}$. Thus, a plurality of insulating layers 101 disposed in the Z-direction, the structures (semiconductor layer 120, gate insulating film 130, and insulating layer 125) inside the memory hole MH that supports the insulating layers 101, and hollow structures including the supporting structures HR are formed. This process is performed by a method, such as wet etching.

Figure 19:
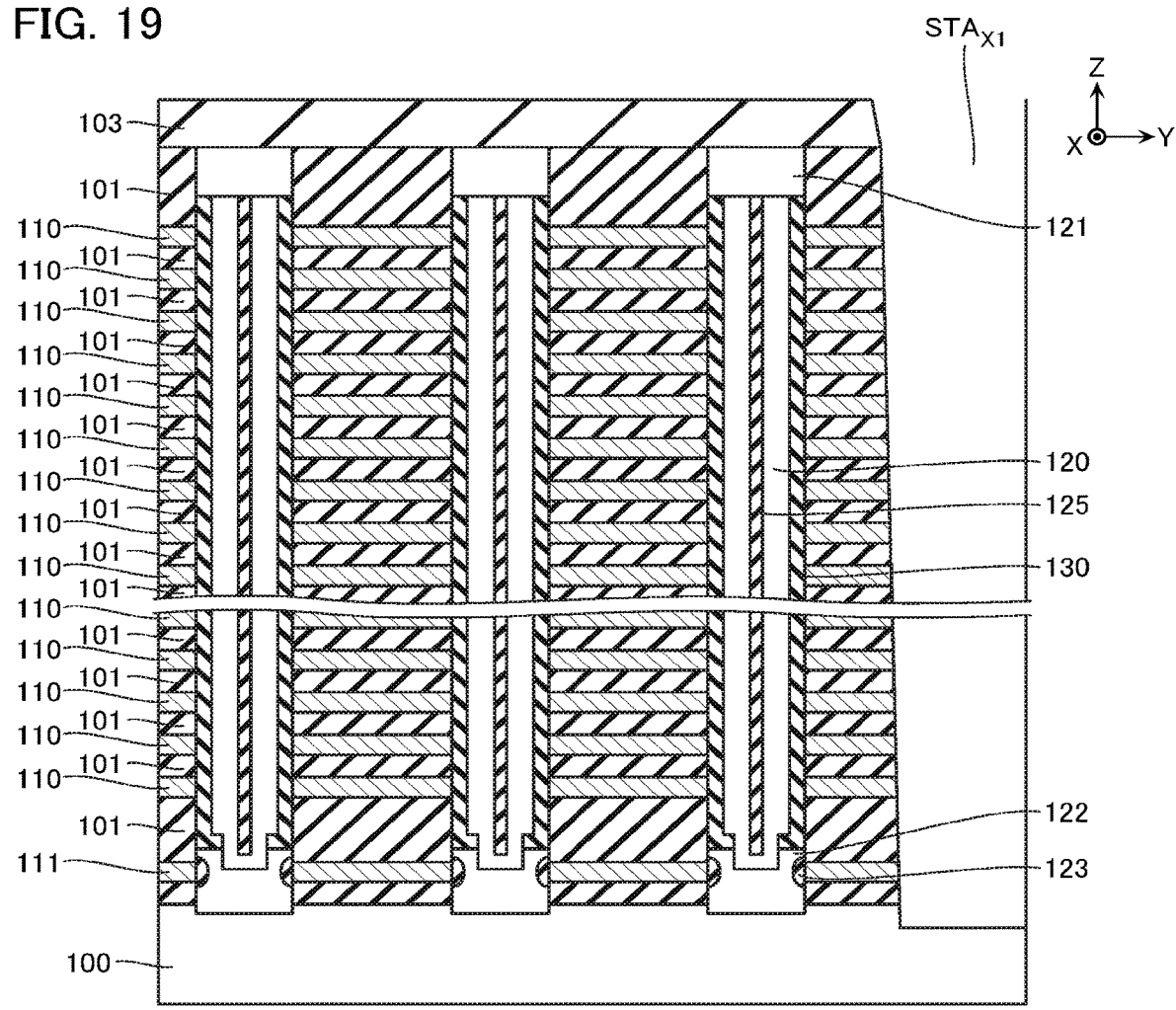
FIG. 19 is a schematic cross-sectional view illustrating the method for manufacturing the semiconductor memory device.

Next, for example, as illustrated in FIG. 19, the insulating layers 123 are formed. This process is performed by a method, such as oxidation treatment. The conductive layers 110 and the conductive layer 111 are formed. This process is performed by a method, such as CVD.

Figure 20:
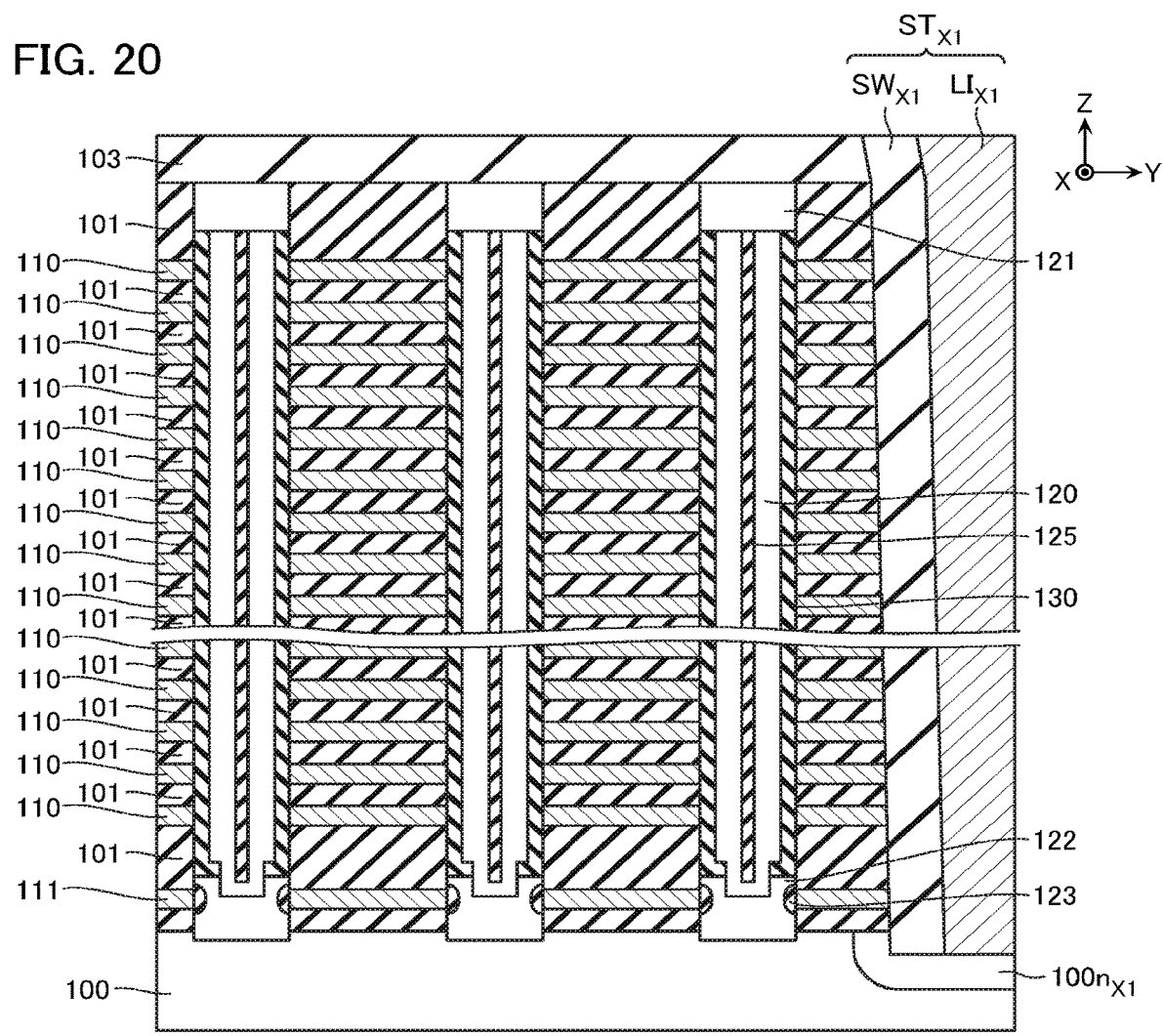
FIG. 20 is a schematic cross-sectional view illustrating the method for manufacturing the semiconductor memory device.
Figure 21:
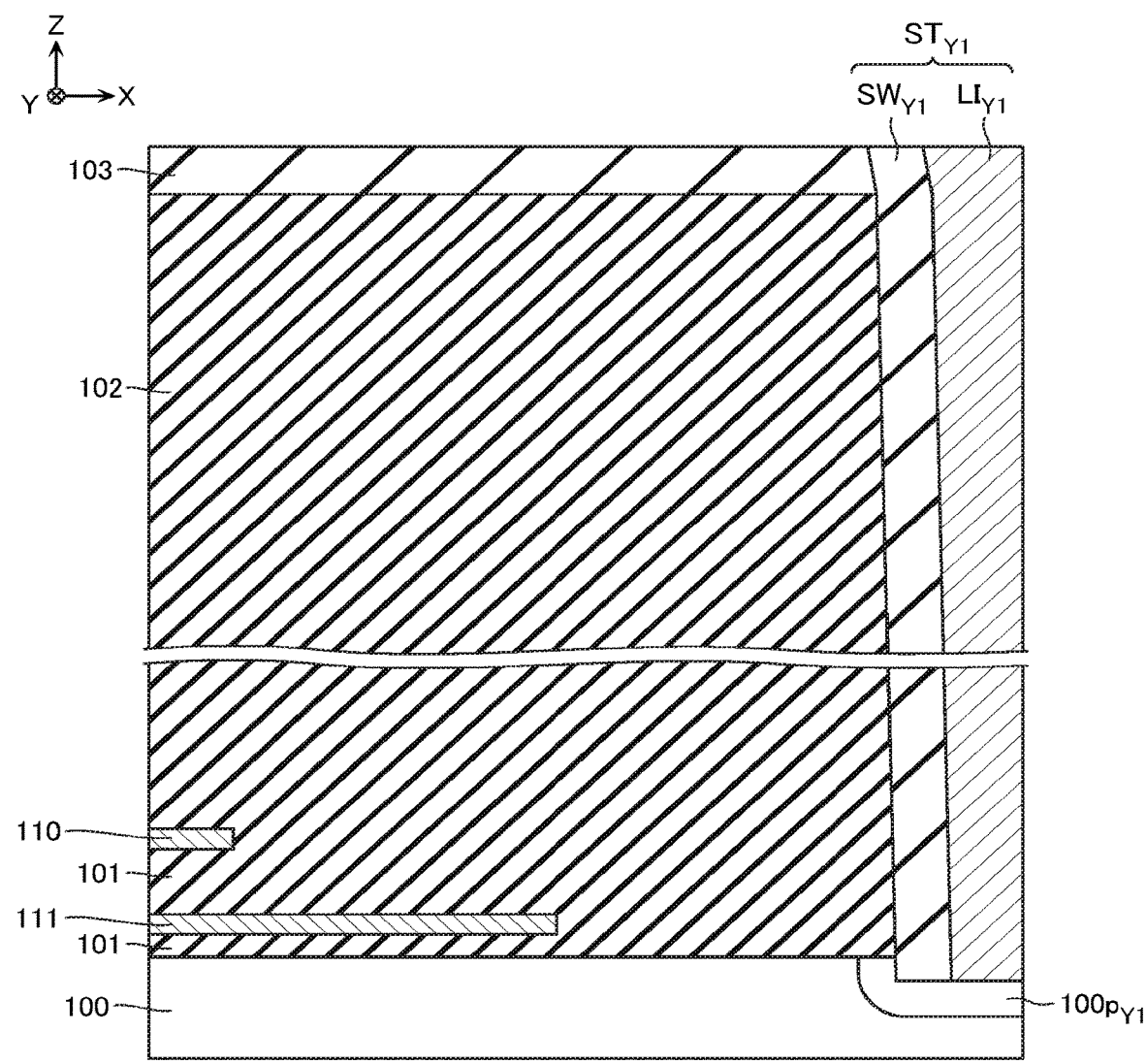
FIG. 21 is a schematic cross-sectional view illustrating the method for manufacturing the semiconductor memory device.

Next, for example, the inter-block structure $ST_{X1}$ is formed in the trench $STA_{X1}$ as illustrated in FIG. 20, and the block side structure $ST_{Y1}$ is formed in the trench $STA_{Y1}$ as illustrated in FIG. 21. In this process, for example, insulating layers of silicon oxide ($SiO_2$) or the like are formed on sidewalls of the trench $STA_{X1}$ and the trench $STA_{Y1}$ to have a thickness so as not to fill the trench $STA_{X1}$ or the trench $STA_{Y1}$ by a method, such as CVD, thereby forming the insulating layers $SW_{X1}$, $SW_{Y1}$. For example, parts of the insulating layers $SW_{X1}$, $SW_{Y1}$ covering the upper surface of the semiconductor substrate 100 are removed by the method, such as RIE, thereby exposing the upper surface of the semiconductor substrate 100. For example, ions are injected to the upper surface of the semiconductor substrate 100 to form the impurity regions $100n_{X1}$, $100p_{Y1}$. For example, conductive layers $LI_{X1}$, $LI_{Y1}$ are formed inside the trench $STA_{X1}$ and the trench $STA_{Y1}$ by the method, such as CVD.

Subsequently, the contacts CC, CS, the wirings m0, m1, and the like are formed, thus forming the semiconductor memory device according to the first embodiment.

COMPARATIVE EXAMPLE

Figure 22:
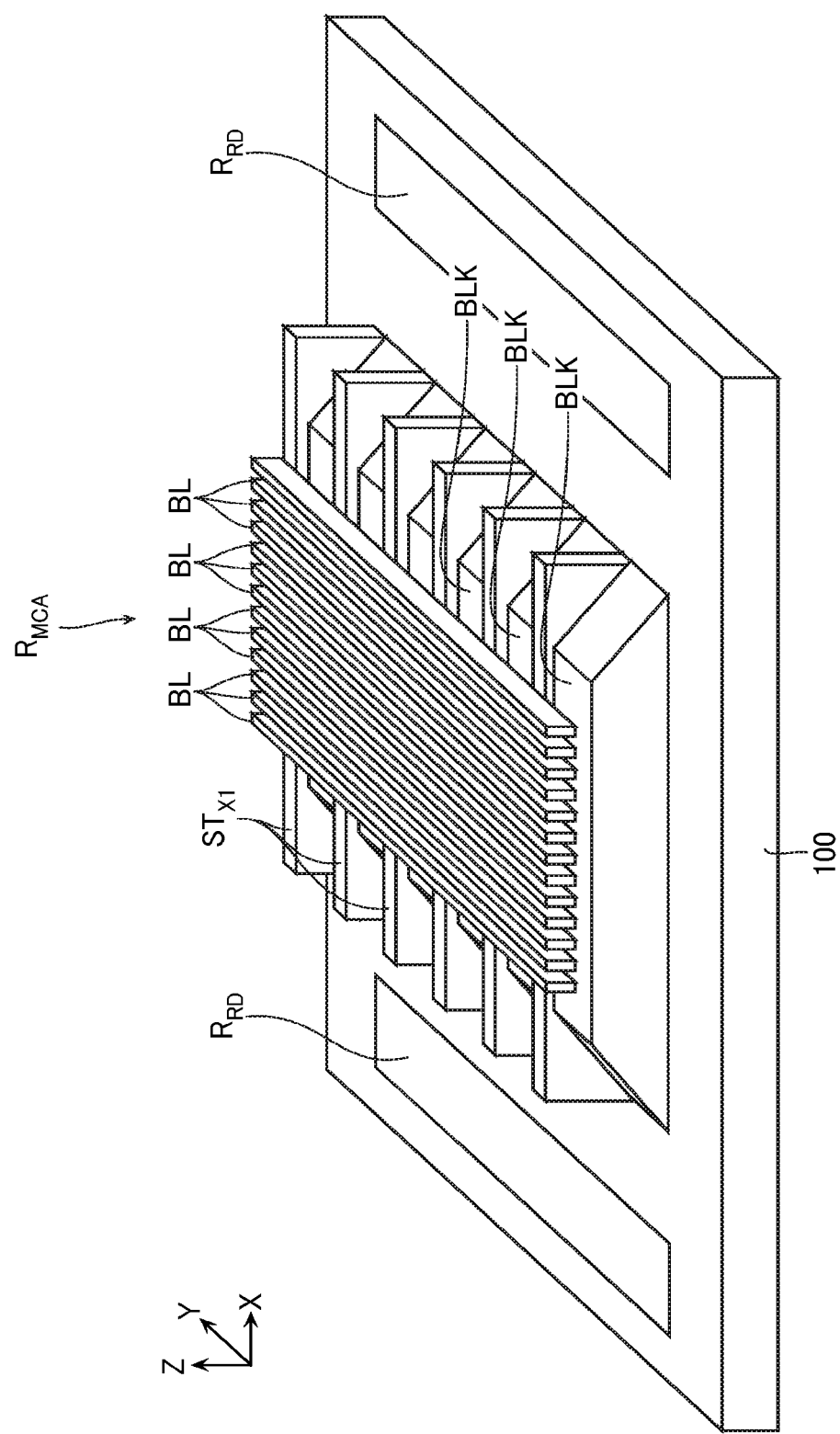
FIG. 22 is a schematic perspective view of a semiconductor memory device according to a comparative example.

Next, a semiconductor memory device according to the comparative example will be described with reference to FIG. 22. The semiconductor memory device according to the comparative example is basically configured similarly to the semiconductor memory device according to the first embodiment. However, the semiconductor memory device according to the comparative example does not include the block side structure $ST_{Y1}$.

Figure 23:
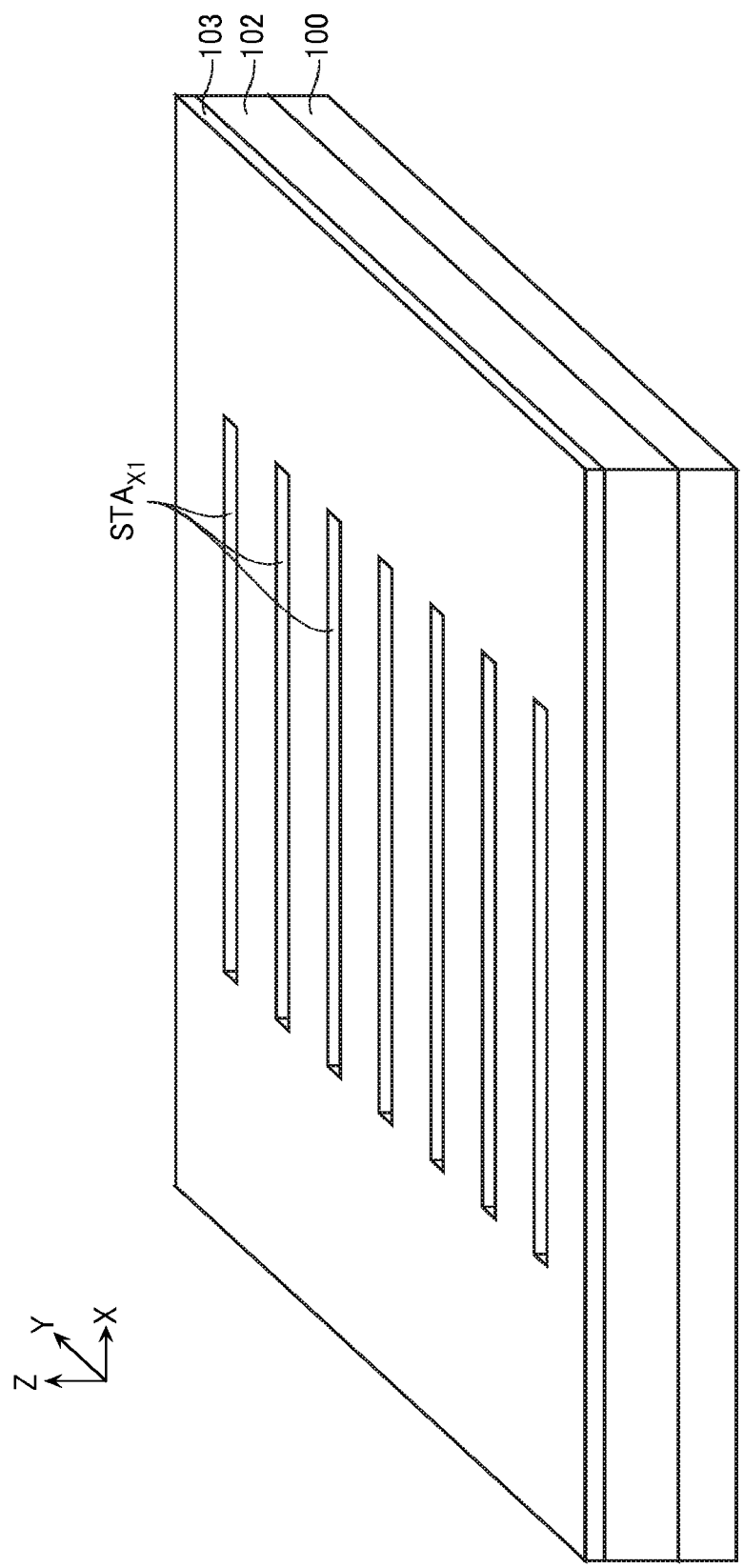
FIG. 23 is a schematic perspective view illustrating a method for manufacturing the semiconductor memory device according to the comparative example.

Next, a method for manufacturing the semiconductor memory device according to the comparative example will be described with reference to FIG. 23. The semiconductor memory device according to the comparative example is basically manufactured similarly to the semiconductor memory device according to the first embodiment. However, in the manufacturing method according to the comparative example, as illustrated in FIG. 23, only the trenches $STA_{X1}$ are formed and the trenches $STA_{Y1}$ are not formed in the processes described with reference to FIG. 15 to FIG. 17.

Effect of First Embodiment

Figure 24:
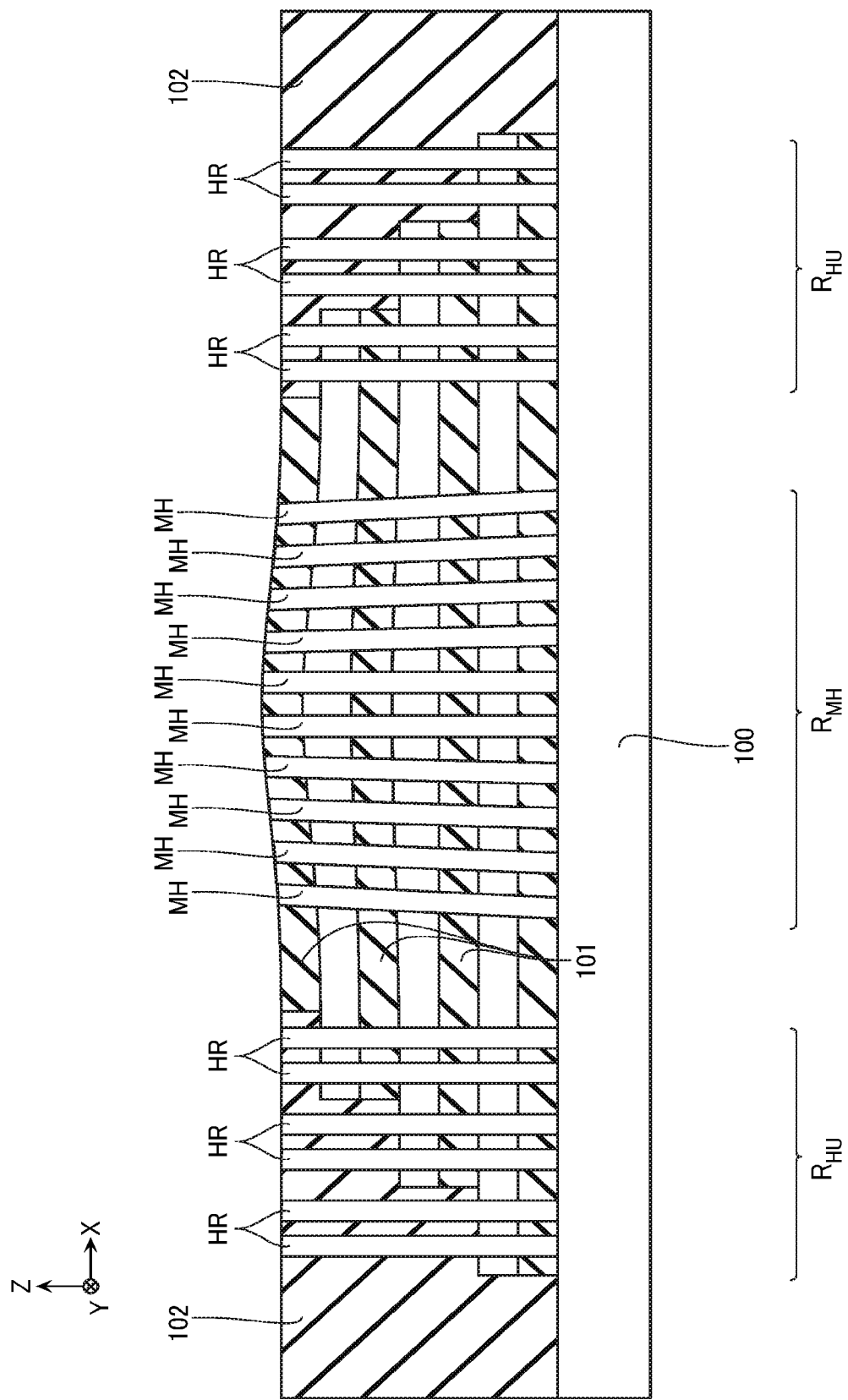
FIG. 24 is a schematic cross-sectional view for describing the manufacturing method.

In the manufacture of the semiconductor memory device according to the comparative example, in the process described with reference to FIG. 18, the hollow structure including the plurality of insulating layers 101 is distorted in some cases, for example, as illustrated in FIG. 24. This is considered because the insulating layers 101 are pressed toward the center side in the X-direction by a compressive stress in the X-direction of the insulating layer 102 disposed in the hook-up region $R_{HU}$.

Figure 25:
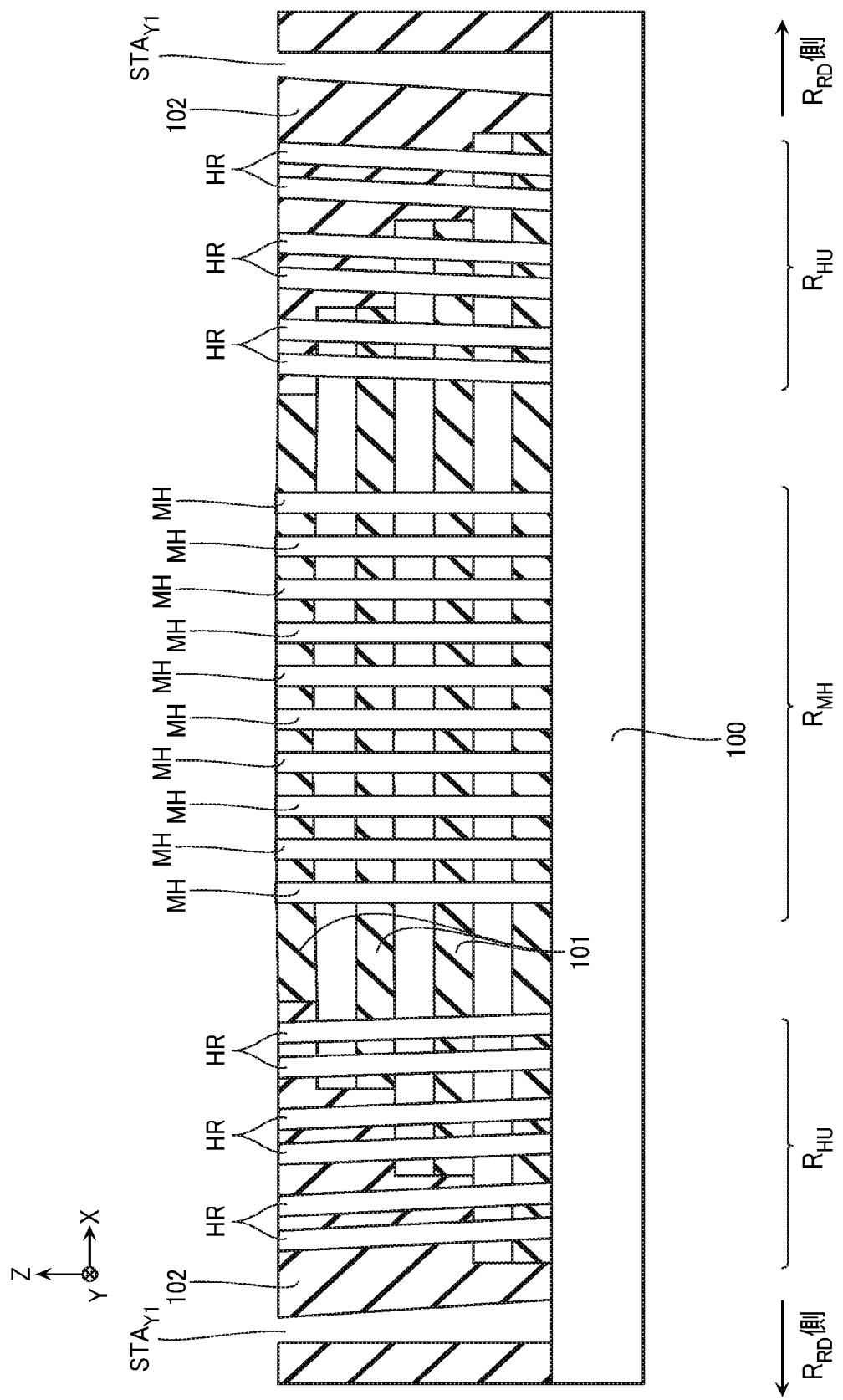
FIG. 25 is a schematic cross-sectional view for describing the method for manufacturing the semiconductor memory device according to the first embodiment.

Here, in the manufacture of the semiconductor memory device according to the first embodiment, in the process described with reference to FIG. 17 and the like, not only the trenches $STA_{X1}$ but also the trenches $STA_{Y1}$ are formed. Therefore, as illustrated in FIG. 25, the compressive stress in the X-direction of the insulating layer 102 can be released to the row decoder region $R_{RD}$ side, thus allowing appropriately reducing the distortion of the hollow structure as described above.

For example, when the trench $STA_{X1}$ intersects with the trench $STA_{Y1}$, a gas of RIE concentrates on a part at which the trench $STA_{X1}$ intersects with the trench $STA_{Y1}$ in the process described with reference to FIG. 17 and the like, thereby breaking the semiconductor substrate 100 at this part in some cases. Therefore, in the manufacturing method according to the first embodiment, the trench $STA_{Y1}$ is separated from the trench $STA_{X1}$. Accordingly, the semiconductor memory device can be appropriately manufactured.

For example, when the trench $STA_{X1}$ intersects with the trench $STA_{Y1}$, the structure disposed on the semiconductor substrate 100 is completely separated in the Y-direction in the process described with reference to FIG. 17 and the like. In this case, the structures are each distorted due to the above-described compressive stress and the like, and a variation occurs in distance (width in the Y-direction of the trench $STA_{X1}$) in the Y-direction between these structures in some cases. Therefore, in the manufacturing method according to the first embodiment, the trench $STA_{Y1}$ is separated from the trench $STA_{X1}$. With this method, the structures separated by the trench $STA_{X1}$ are mutually connected via the insulating layers 102, 103. Therefore, positional relationships among the structures are fixed via the insulating layers 102, 103, thereby allowing to reduce the occurrence of variation as described above. Accordingly, the semiconductor memory device can be appropriately manufactured.

When the compressive stress in the X-direction of the insulating layer 102 is to be transferred to the row decoder region $R_{RD}$ side by the trench $STA_{Y1}$ as described above, the trench $STA_{Y1}$ is preferably disposed at the proximity of the memory cell array region $R_{MCA}$. This is because as the distance between the trench $STA_{Y1}$ and the memory cell array region $R_{MCA}$ decreases, the width in the X-direction of the insulating layer 102 decreases, and the insulating layer 102 is easily deformed in the X-direction. Therefore, as described with reference to FIG. 8, in the first embodiment, the trench $STA_{Y1}$ is disposed inside the guard ring region $R_{GR1}$. Accordingly, the distortion of the hollow structure as described above can be appropriately reduced.

As described with reference to FIG. 9 and the like, the conductive layer $LI_{Y1}$ according to the embodiment extends in the Y-direction along the plurality of memory blocks BLK arranged in the Y-direction, and is supplied with the ground voltage. In this configuration, since the conductive layer $LI_{Y1}$ functions as a shield electrode, the memory blocks BLK can be protected from an external electromagnetic wave.

Second Embodiment

Figure 26:
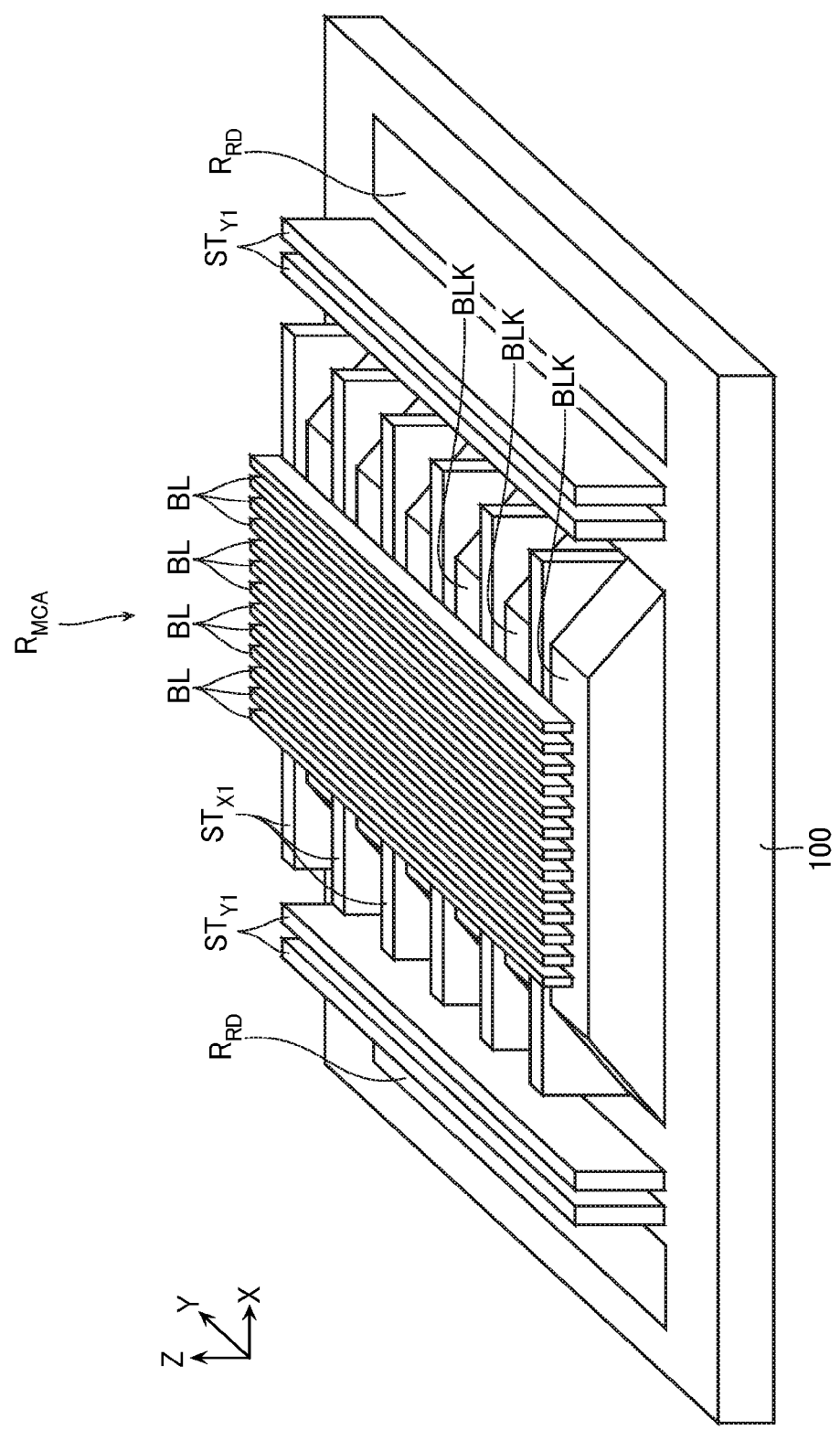
FIG. 26 is a schematic perspective view of a semiconductor memory device according to a second embodiment.
Figure 27:
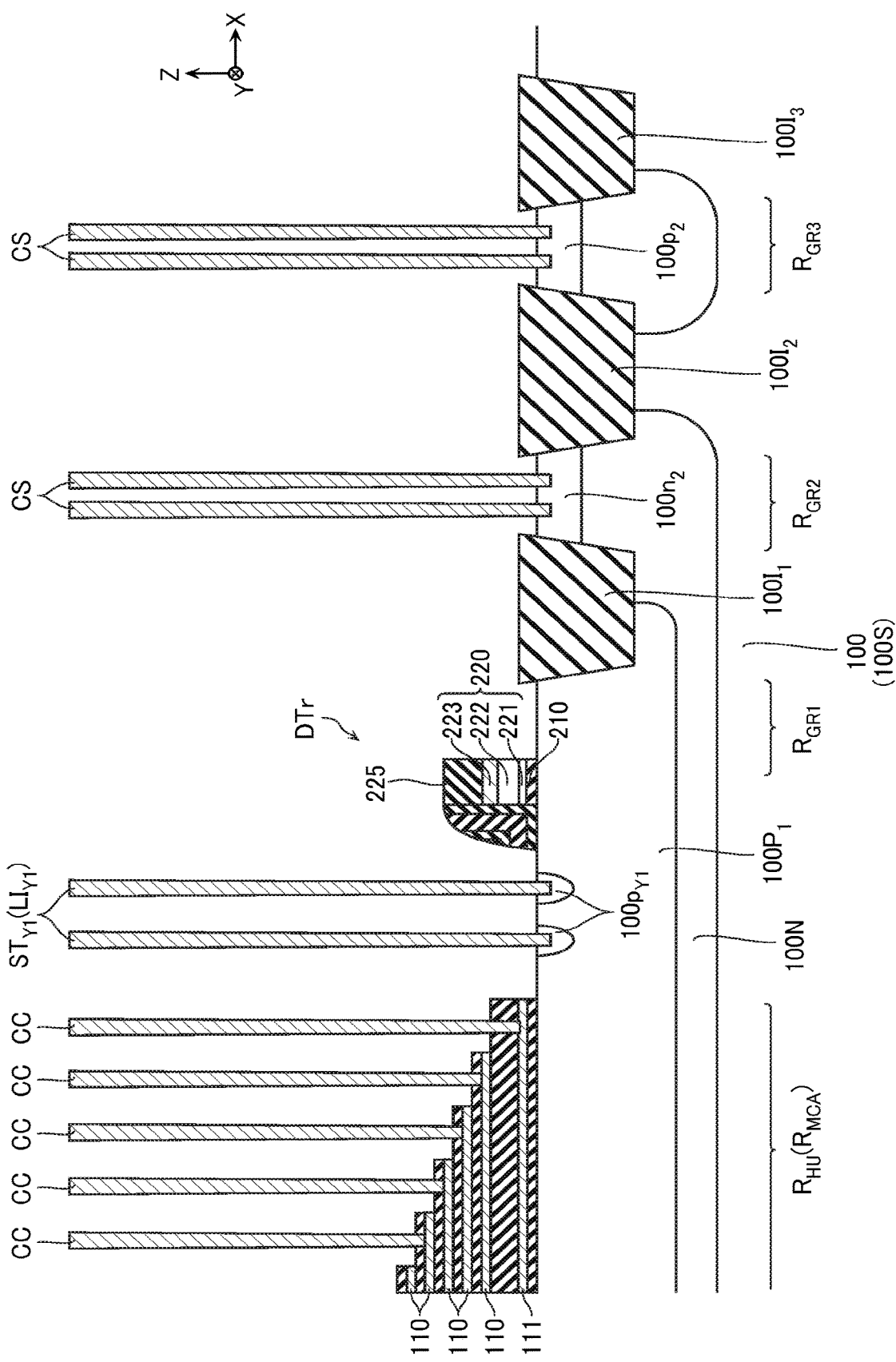
FIG. 27 is a schematic cross-sectional view illustrating a configuration of a part of the semiconductor memory device according to the second embodiment.

Next, a semiconductor memory device according to the second embodiment will be described with reference to FIG. 26 and FIG. 27. The semiconductor memory device according to the second embodiment is basically configured similarly to the semiconductor memory device according to the first embodiment. However, as illustrated in FIG. 2 and the like, the semiconductor memory device according to the first embodiment includes the single block side structure $ST_{Y1}$ at each of both sides in the X-direction of the memory cell array region $R_{MCA}$. Meanwhile, as illustrated in FIG. 26, in the second embodiment, the two block side structures $ST_{Y1}$ are disposed at each of both sides in the X-direction of the memory cell array region $R_{MCA}$. As illustrated in FIG. 27, these two block side structures $ST_{Y1}$ are both disposed at the memory cell array region $R_{MCA}$ side with respect to the dummy transistor structure DTr.

In this configuration, since the two conductive layers $LI_{Y1}$ disposed at the proximity of the memory cell array region $R_{MCA}$ both function as the shield electrodes, the memory blocks BLK can be more appropriately protected from the external electromagnetic wave.

Third Embodiment

Figure 28:
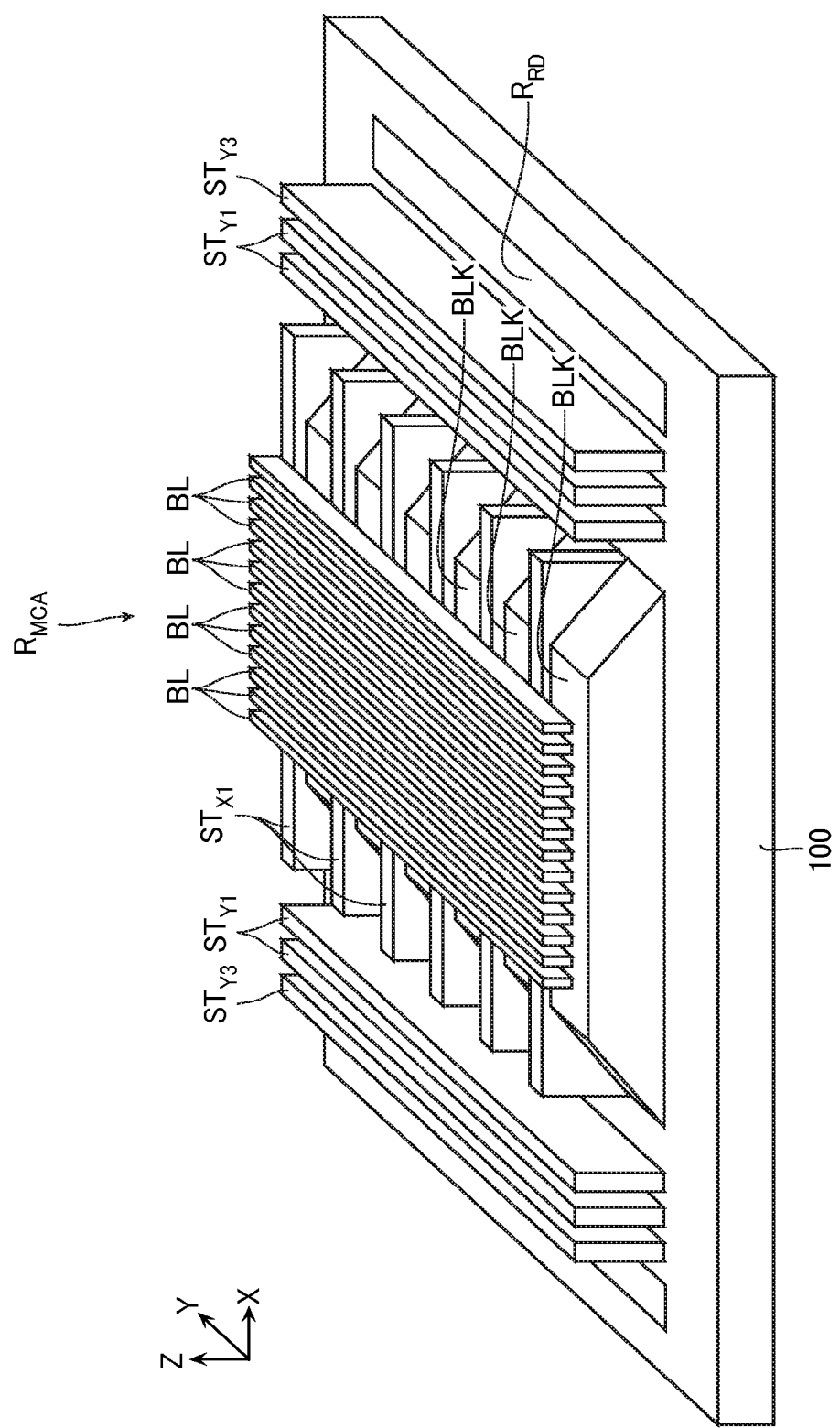
FIG. 28 is a schematic perspective view of a semiconductor memory device according to a third embodiment.
Figure 29:
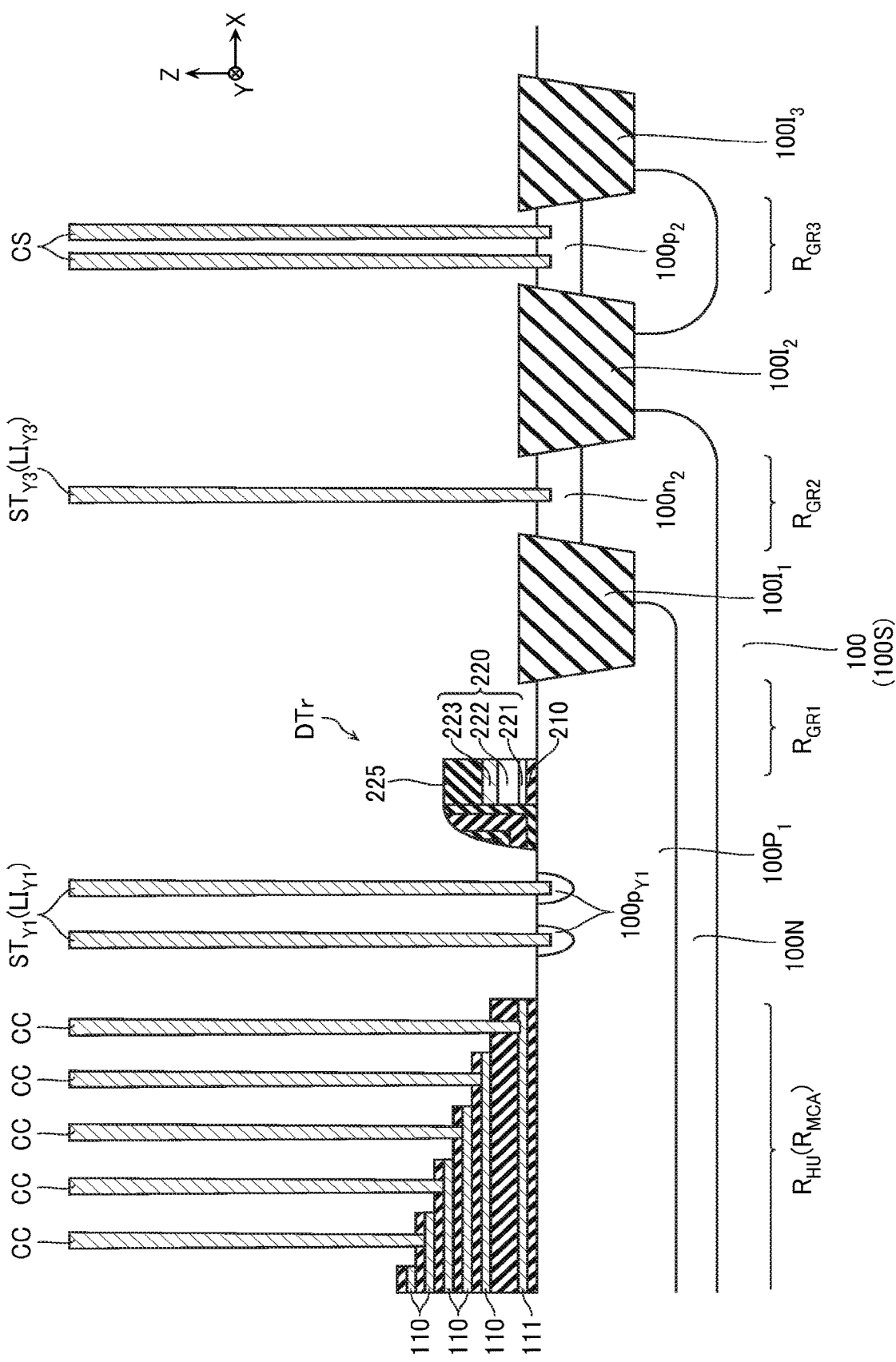
FIG. 29 is a schematic cross-sectional view illustrating a configuration of a part of the semiconductor memory device according to the third embodiment.

Next, a semiconductor memory device according to the third embodiment will be described with reference to FIG. 28 and FIG. 29. The semiconductor memory device according to the third embodiment is basically configured similarly to the semiconductor memory device according to the second embodiment. However, as illustrated in FIG. 26, in the semiconductor memory device according to the second embodiment, the two block side structures $ST_{Y1}$ are disposed at each of both sides in the X-direction of the memory cell array region $R_{MCA}$. Meanwhile, as illustrated in FIG. 28, in the third embodiment, one block side structure $ST_{Y3}$ is further disposed at each of both sides in the X-direction of the memory cell array region $R_{MCA}$ in addition to the two block side structures $ST_{Y1}$. As illustrated in FIG. 29, the block side structure $ST_{Y3}$ is disposed in the guard ring region $R_{GR2}$.

The block side structure $ST_{Y3}$ is basically configured similarly to the block side structure $ST_{Y1}$. However, the conductive layer $LI_{Y1}$ included in the block side structure $ST_{Y1}$ is connected to the P-type well region $100P_1$ via the P-type impurity region $100p_{Y1}$. Meanwhile, a conductive layer $LI_{Y3}$ included in the block side structure $ST_{Y3}$ is connected to the N-type well region 100N via the impurity region $100n_2$.

In this configuration, the two conductive layers $LI_{Y1}$ disposed at the proximity of the memory cell array region $R_{MCA}$ and the conductive layer $LI_{Y3}$ all function as the shield electrodes, the memory blocks BLK can be more appropriately protected from the external electromagnetic wave.

Fourth Embodiment

Figure 30:
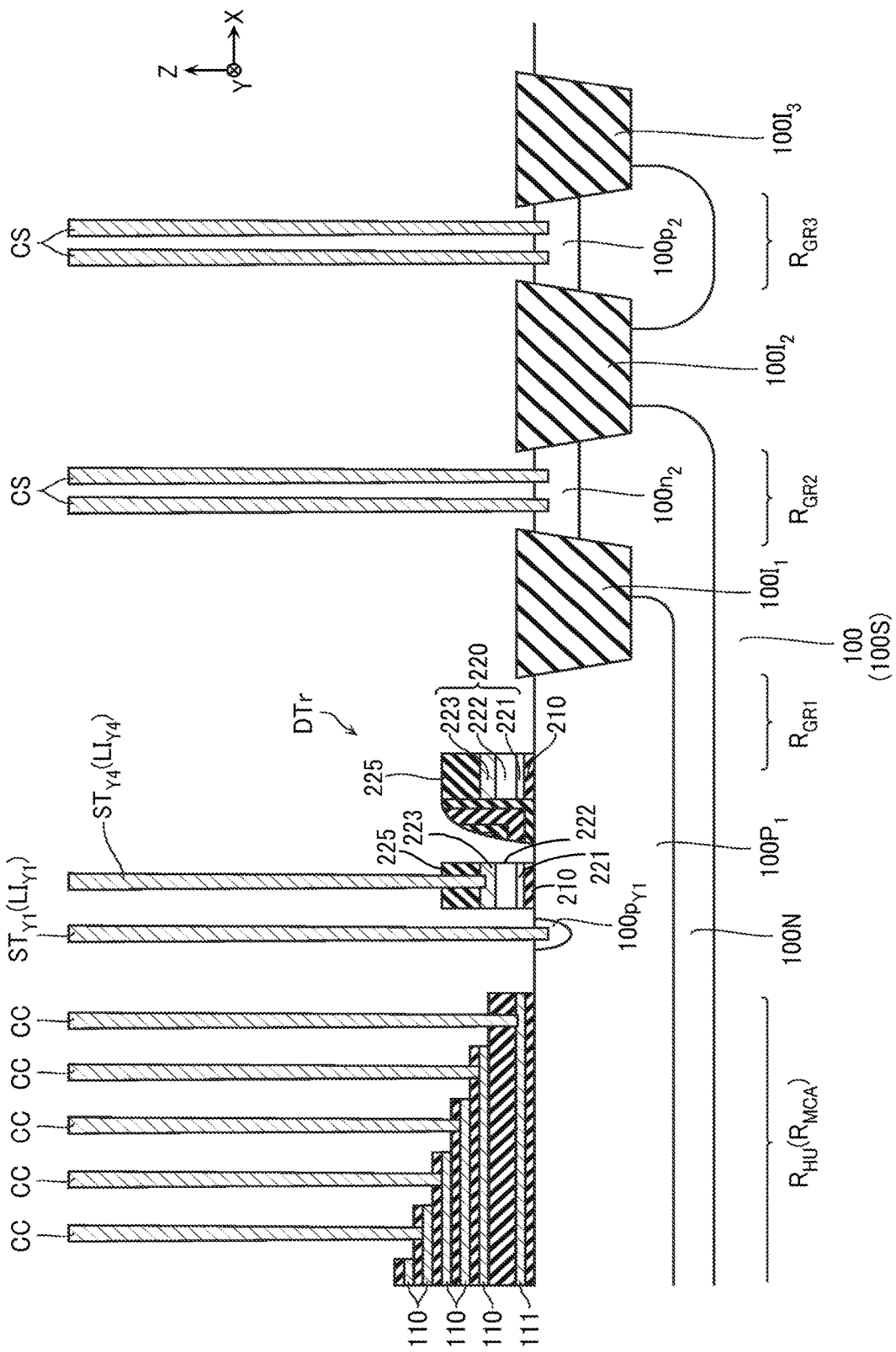
FIG. 30 is a schematic cross-sectional view illustrating a configuration of a part of a semiconductor memory device according to a fourth embodiment.

Next, a semiconductor memory device according to the fourth embodiment will be described with reference to FIG. 30. The semiconductor memory device according to the fourth embodiment is basically configured similarly to the semiconductor memory device according to the first embodiment. However, as illustrated in FIG. 2 and the like, the semiconductor memory device according to the first embodiment includes the single block side structure $ST_{Y1}$ at each of both sides in the X-direction of the memory cell array region $R_{MCA}$. Meanwhile, as illustrated in FIG. 30, in the fourth embodiment, one block side structure $ST_{Y4}$ is further disposed at each of both sides in the X-direction of the memory cell array region $R_{MCA}$. As illustrated in FIG. 30, the block side structure $ST_{Y4}$ is disposed between the dummy transistor structure DTr and the block side structure $ST_{Y1}$.

The block side structure $ST_{Y4}$ is basically configured similarly to the block side structure $ST_{Y1}$. However, a dummy transistor structure DTr' is disposed below the block side structure $ST_{Y4}$. The dummy transistor structure DTr' is configured similarly to the dummy transistor structure DTr. A lower end of a conductive layer $LI_{Y4}$ included in the block side structure $ST_{Y4}$ is connected to the upper surface of the conductive layer 223 included in this dummy transistor structure DTr'.

Also in this configuration, since both the conductive layer $LI_{Y1}$ and the conductive layer $LI_{Y4}$ disposed at the proximity of the memory cell array region $R_{MCA}$ function as the shield electrodes, the memory blocks BLK can be more appropriately protected from the external electromagnetic wave.

Fifth Embodiment

Figure 31:
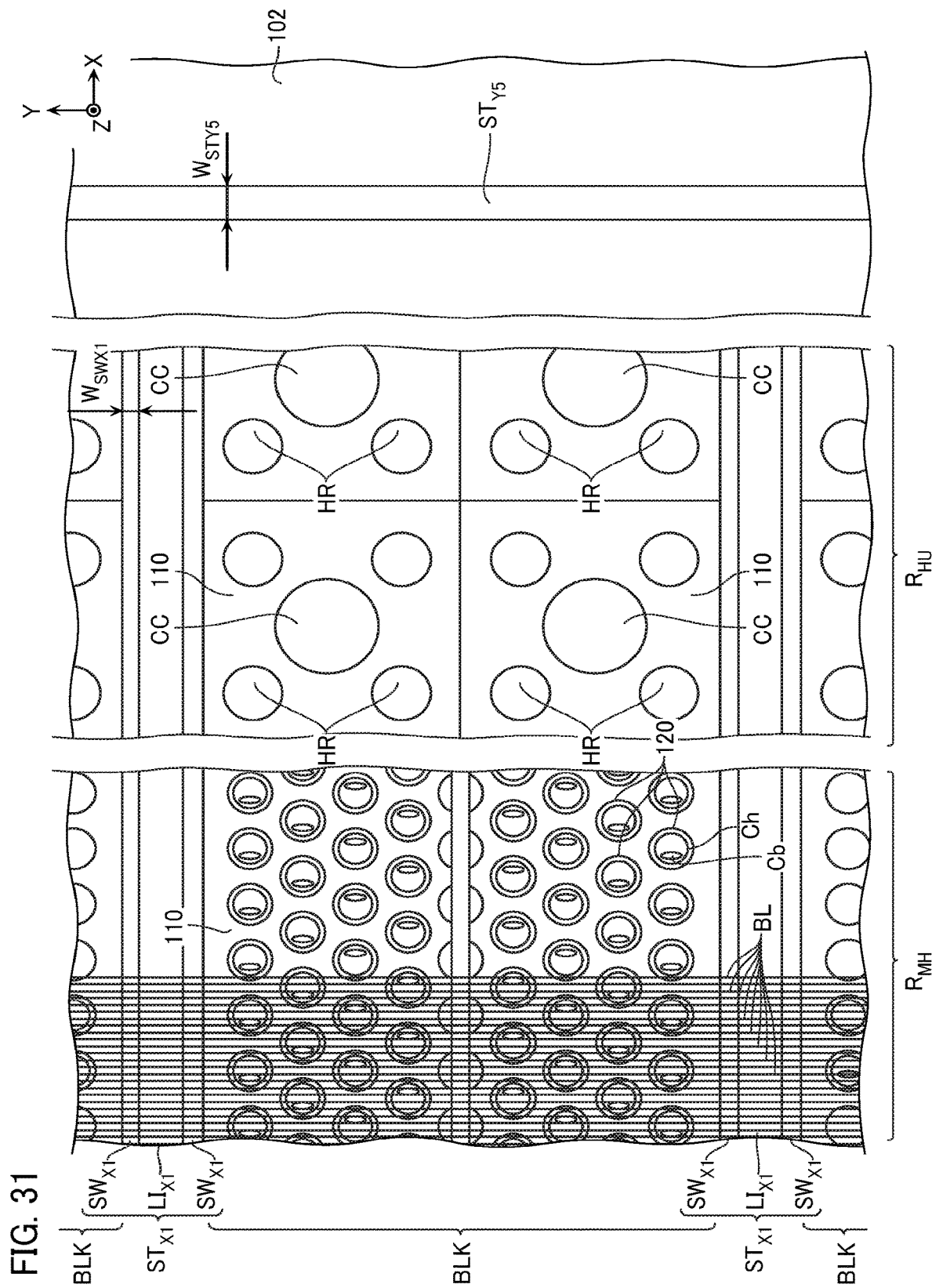
FIG. 31 is a schematic plan view illustrating a configuration of a part of a semiconductor memory device according to a fifth embodiment.

Next, with reference to FIG. 31 and FIG. 32, a semiconductor memory device according to the fifth embodiment will be described. The semiconductor memory device according to the fifth embodiment is basically configured similarly to the semiconductor memory device according to the first embodiment. However, the semiconductor memory device according to the fifth embodiment includes block side structures $ST_{Y5}$ instead of the block side structures $ST_{Y1}$.

The block side structure $ST_{Y5}$ is basically configured similarly to the block side structure $ST_{Y1}$. However, as described with reference to FIG. 4, FIG. 10, and the like, the block side structure $ST_{Y1}$ according to the first embodiment includes the conductive layer $LI_{Y1}$. Meanwhile, as illustrated in FIG. 31 and FIG. 32, the block side structure $ST_{Y5}$ according to the fifth embodiment does not include the conductive layer $LI_{Y1}$, but includes an insulating layer of silicon oxide ($SiO_2$) or the like. As illustrated in FIG. 31, a width $W_{STY5}$ in the X-direction of the block side structure $ST_{Y5}$ has a magnitude equal to or less than a width $2W_{SWX1}$ that is a double of a width $W_{SWX1}$ in the Y-direction of the insulating layer $SW_{X1}$ included in the inter-block structure $ST_{X1}$.

The semiconductor memory device according to the fifth embodiment is basically manufactured similarly to the semiconductor memory device according to the first embodiment. However, in the manufacturing method according to the fifth embodiment, in the processes described with reference to FIG. 15 to FIG. 17, the width in the X-direction of the trench $STA_{Y1}$ is decreased compared with the width in the Y-direction of the trench $STA_{X1}$. When the insulating layer $SW_{X1}$ is formed in the process described with reference to FIG. 20, an insulating layer of silicon oxide ($SiO_2$) or the like is formed to have a film thickness so as not to fill the trench $STA_{X1}$ but to fill the trench $STA_{Y1}$ with this insulating layer $SW_{X1}$.

With this configuration, the distortion of the hollow structure as described above can be reduced with a smaller area.

Figure 32:
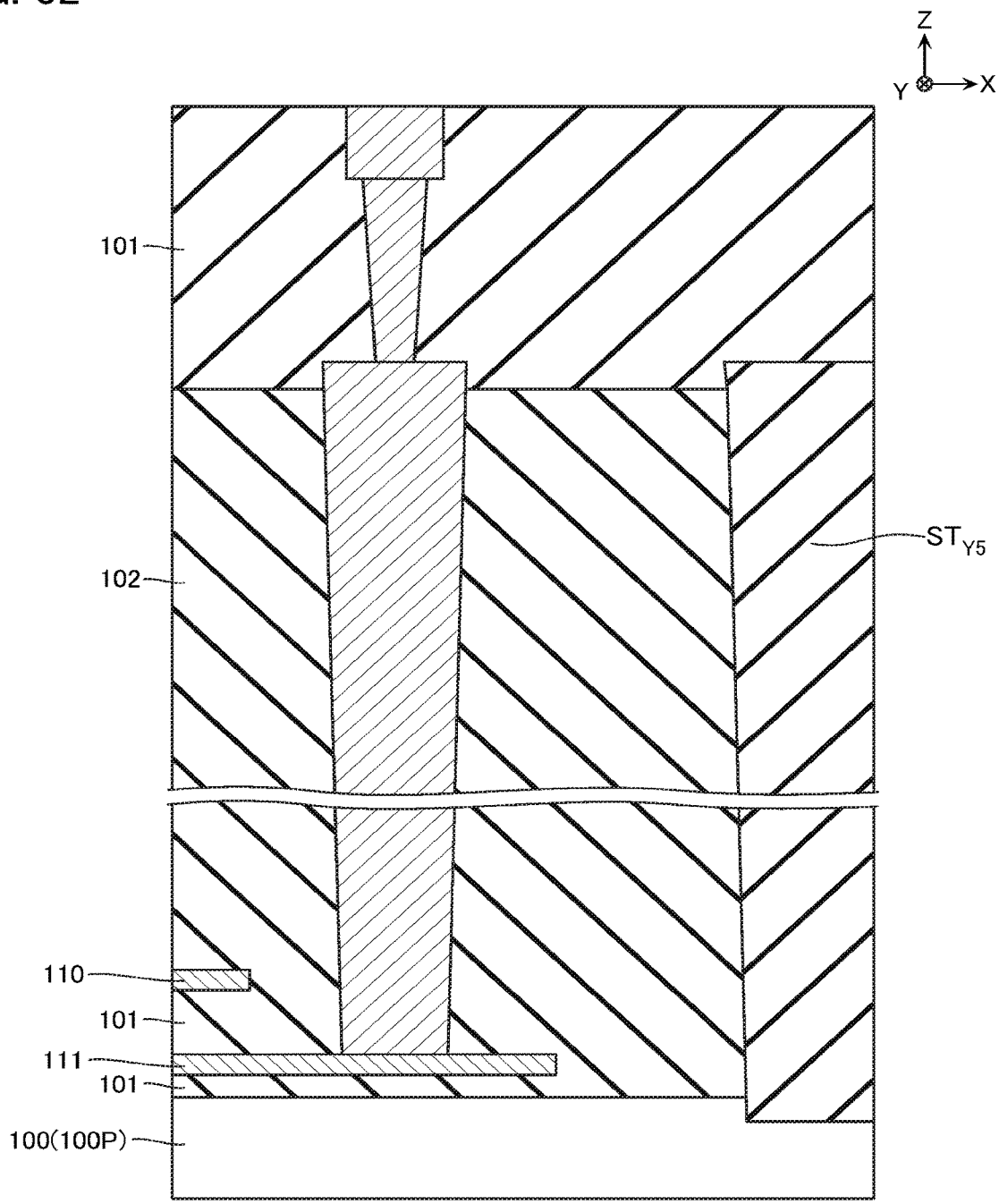
FIG. 32 is a schematic cross-sectional view illustrating a configuration of a part of the semiconductor memory device according to the fifth embodiment.
Figure 33:
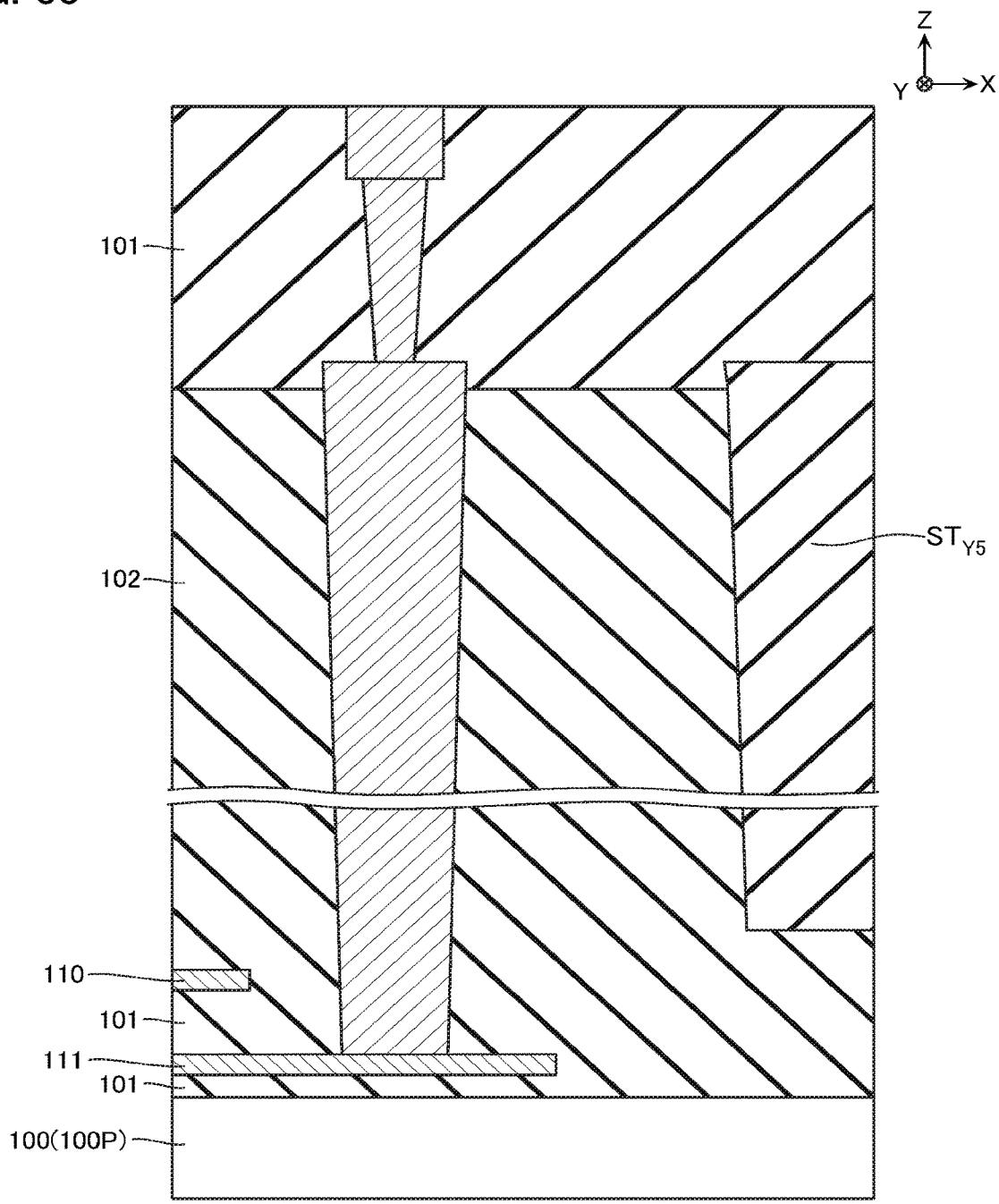
FIG. 33 is a schematic cross-sectional view illustrating a configuration of a part of another exemplary configuration of the semiconductor memory device according to the fifth embodiment.

FIG. 32 illustrates the example where the lower end of the block side structure $ST_{Y5}$ reaches the upper surface of the semiconductor substrate 100. However, for example, as illustrated in FIG. 33, the lower end of the block side structure $ST_{Y5}$ may be positioned above the upper surface of the semiconductor substrate 100, the conductive layer 111, and a part of the conductive layers 110.

Sixth Embodiment

Next, a semiconductor memory device according to the sixth embodiment will be described with reference to FIG.

Figure 35:
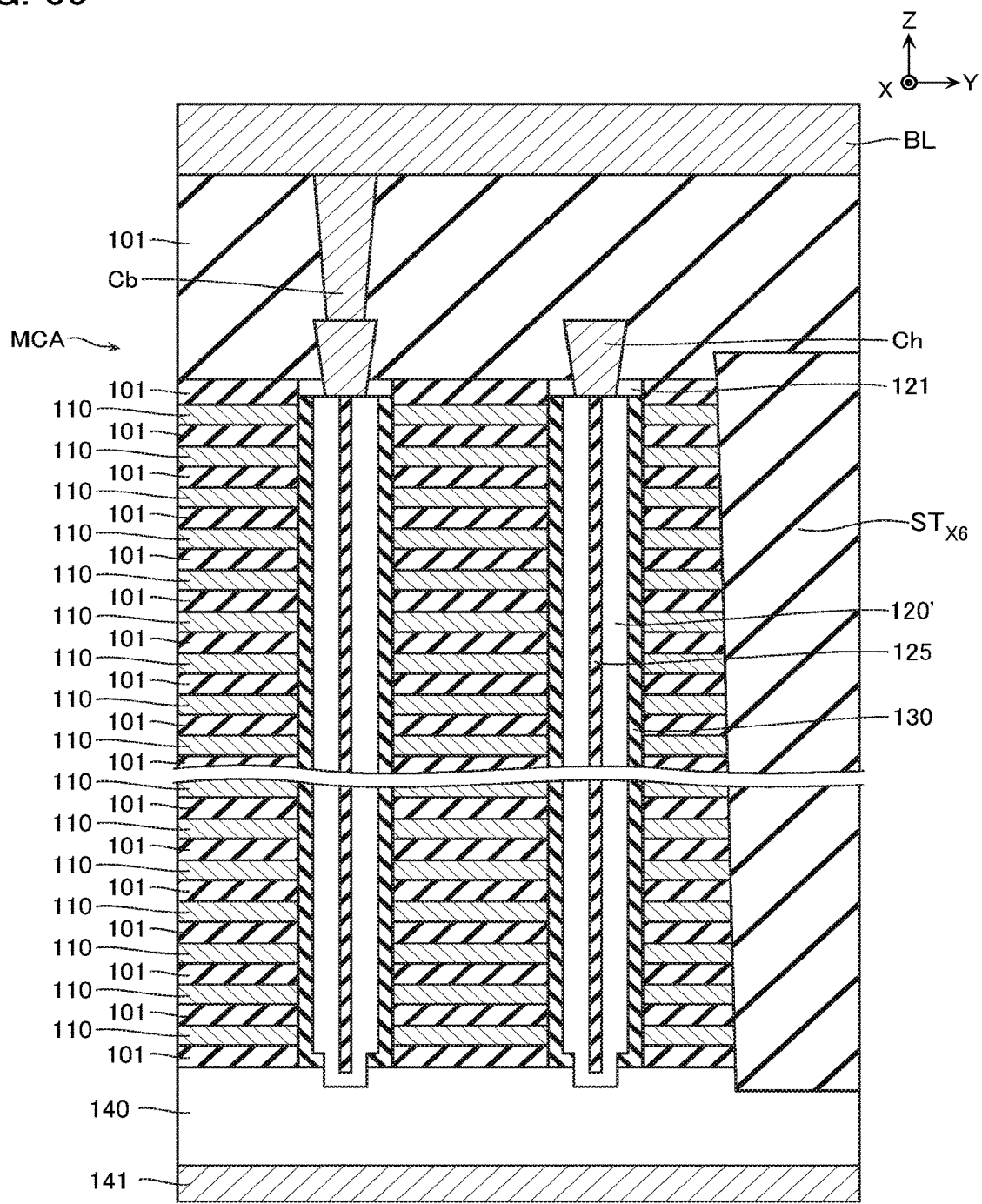
FIG. 35 is a schematic cross-sectional view illustrating a configuration of a part of the semiconductor memory device according to the sixth embodiment.

34 and FIG. 35. The semiconductor memory device according to the sixth embodiment is basically configured similarly to the semiconductor memory device according to the first embodiment.

Figure 34:
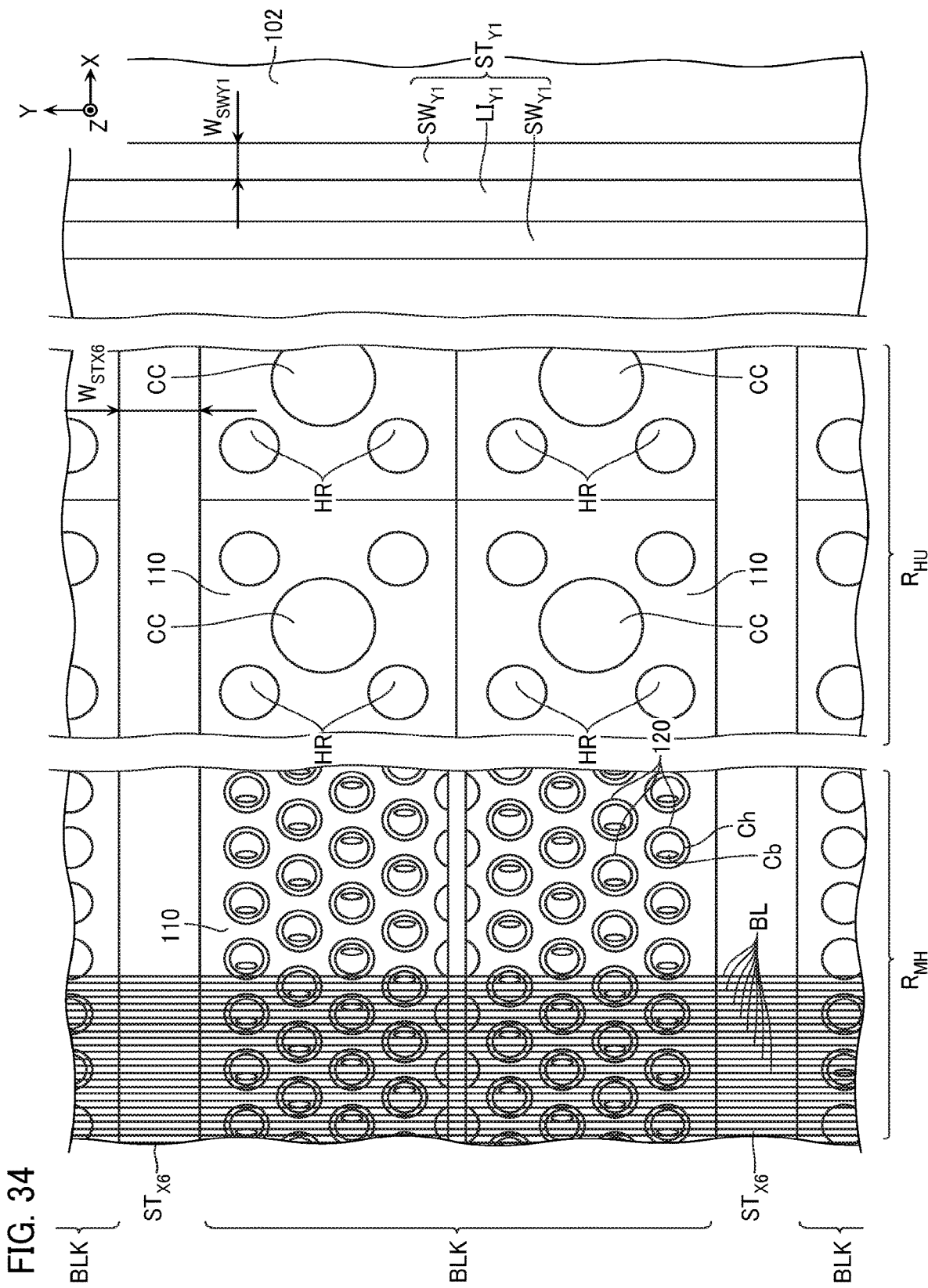
FIG. 34 is a schematic plan view illustrating a configuration of a part of a semiconductor memory device according to a sixth embodiment.

However, the semiconductor memory device according to the sixth embodiment includes an inter-block structure $ST_{X6}$ instead of the inter-block structure $ST_{X1}$. The inter-block structure $ST_{X6}$ is basically configured similarly to the inter-block structure $ST_{X1}$. However, as described with reference to FIG. 5 and the like, the inter-block structure $ST_{X1}$ according to the first embodiment includes the conductive layer $LI_{X1}$. Meanwhile, as illustrated in FIG. 34 and FIG. 35, the inter-block structure $ST_{X6}$ according to the sixth embodiment does not include the conductive layer $LI_{X1}$, but formed of silicon oxide ($SiO_2$) or the like. As illustrated in FIG. 34, a width $W_{STX6}$ in the Y-direction of the inter-block structure $ST_{X6}$ has a magnitude equal to or less than a width $2W_{SWY1}$ that is a double of a width $W_{SWY1}$ in the X-direction of the insulating layer $SW_{Y1}$ included in the block side structure $ST_{Y1}$.

As illustrated in FIG. 35, the semiconductor memory device according to the sixth embodiment includes a semiconductor layer 140 and a conductive layer 141 that are disposed to be separated from the semiconductor substrate 100 above the semiconductor substrate 100. The semiconductor layer 140 is a semiconductor layer of, for example, polycrystalline silicon containing N-type impurities, such as phosphorus (P). The conductive layer 141 is connected to a lower surface of the semiconductor layer 140. The conductive layer 141 may be a metal, such as tungsten (W), may be tungsten silicide or the like, or may be a conductive layer of another material. While a semiconductor layer 120' according to the embodiment is basically configured similarly to the semiconductor layer 120, the semiconductor layer 120' is connected not to the P-type well region 100P but to the N-type well region 100N of the semiconductor substrate 100.

In the semiconductor memory device according to the sixth embodiment, the block side structure $ST_{Y1}$ is disposed at the position overlapping the conductive layer 141 viewed in the Z-direction. The lower end of the block side structure $ST_{Y1}$ is connected to the semiconductor layer 140.

Other Embodiments

The semiconductor memory devices according to the first embodiment to the sixth embodiment have been exemplified above. However, the above-described configurations and the manufacturing methods are merely examples, and the specific configurations and the like are appropriately adjustable.

For example, the lower end of the semiconductor layer 120 according to the first embodiment to the fifth embodiment is connected to the P-type well region $100P_1$ of the semiconductor substrate 100. However, this configuration is merely an example, and a specific configuration is appropriately adjustable. For example, the lower end of the semiconductor layer 120 may be connected to the N-type well region 100N. For example, as exemplified in the sixth embodiment, a semiconductor layer of, for example, polycrystalline silicon containing N-type impurities, such as phosphorus (P), or P-type impurities, such as boron (B), may be disposed above the semiconductor substrate 100, and the lower end of the semiconductor layer 120 may be connected to this semiconductor layer. In this case, the block side structures $ST_{Y1}$, $ST_{Y3}$, $ST_{Y4}$, and $ST_{Y5}$ may be disposed not at the position overlapping the P-type well region $100P_1$ viewed in the Z-direction but at the position overlapping this semiconductor layer viewed in the Z-direction. In addition, in this case, the lower ends of the inter-block structures $ST_{X1}$, $ST_{X6}$ and the lower ends of the block side structures $ST_{Y1}$, $ST_{Y3}$, $ST_{Y4}$, and $ST_{Y5}$ may be connected not to the surface of the semiconductor substrate 100 but to this semiconductor layer.

The semiconductor memory devices according to the respective embodiments only need to each include at least one of the block side structures $ST_{Y1}$, $ST_{Y3}$, $ST_{Y4}$, and $ST_{Y5}$. For example, the semiconductor memory device according to the first embodiment may include the block side structure $ST_{Y3}$ or the block side structure $ST_{Y4}$ instead of the block side structure $ST_{Y1}$. For example, the semiconductor memory device according to the sixth embodiment may include the block side structure $ST_{Y5}$ in addition to the block side structure $ST_{Y1}$ or instead of the block side structure $ST_{Y1}$. In this case, the width in the X-direction of the block side structure $ST_{Y5}$ may be approximately same as the width $W_{STX6}$ in the Y-direction of the inter-block structure $ST_{X6}$, or may be smaller than the width $W_{STX6}$.

Figure 36:
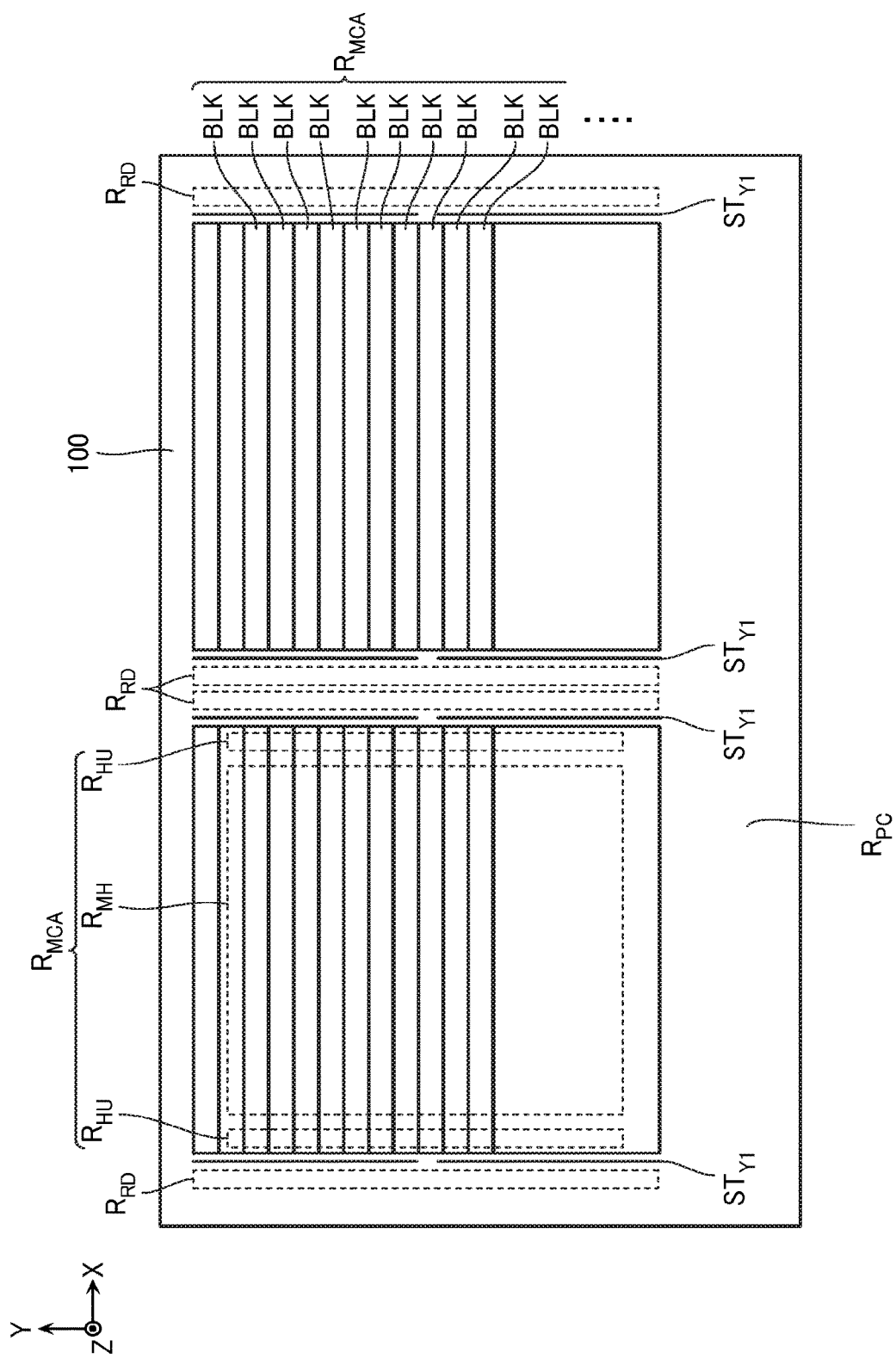
FIG. 36 is a schematic plan view illustrating a configuration of a semiconductor memory device according to another embodiment.

In the example of FIG. 1, the length in the Y-direction of the block side structure $ST_{Y1}$ matches the length in the Y-direction of the memory cell array region $R_{MCA}$. However, this configuration is merely an example, and a specific configuration is appropriately adjustable. For example, as illustrated in FIG. 36, the length in the Y-direction of the block side structure $ST_{Y1}$ may be decreased compared with the length in the Y-direction of the memory cell array region $R_{MCA}$, and a plurality of block side structures $ST_{Y1}$ may be disposed in the Y-direction. In this case, for example, the length in the Y-direction of the block side structure $ST_{Y1}$ may match the width in the Y-direction of one or a plurality of memory blocks BLK, or may be greater than this width. The same applies to the block side structures $ST_{Y3}$, $ST_{Y4}$, and $ST_{Y5}$ according to the other embodiments.

Figure 37:
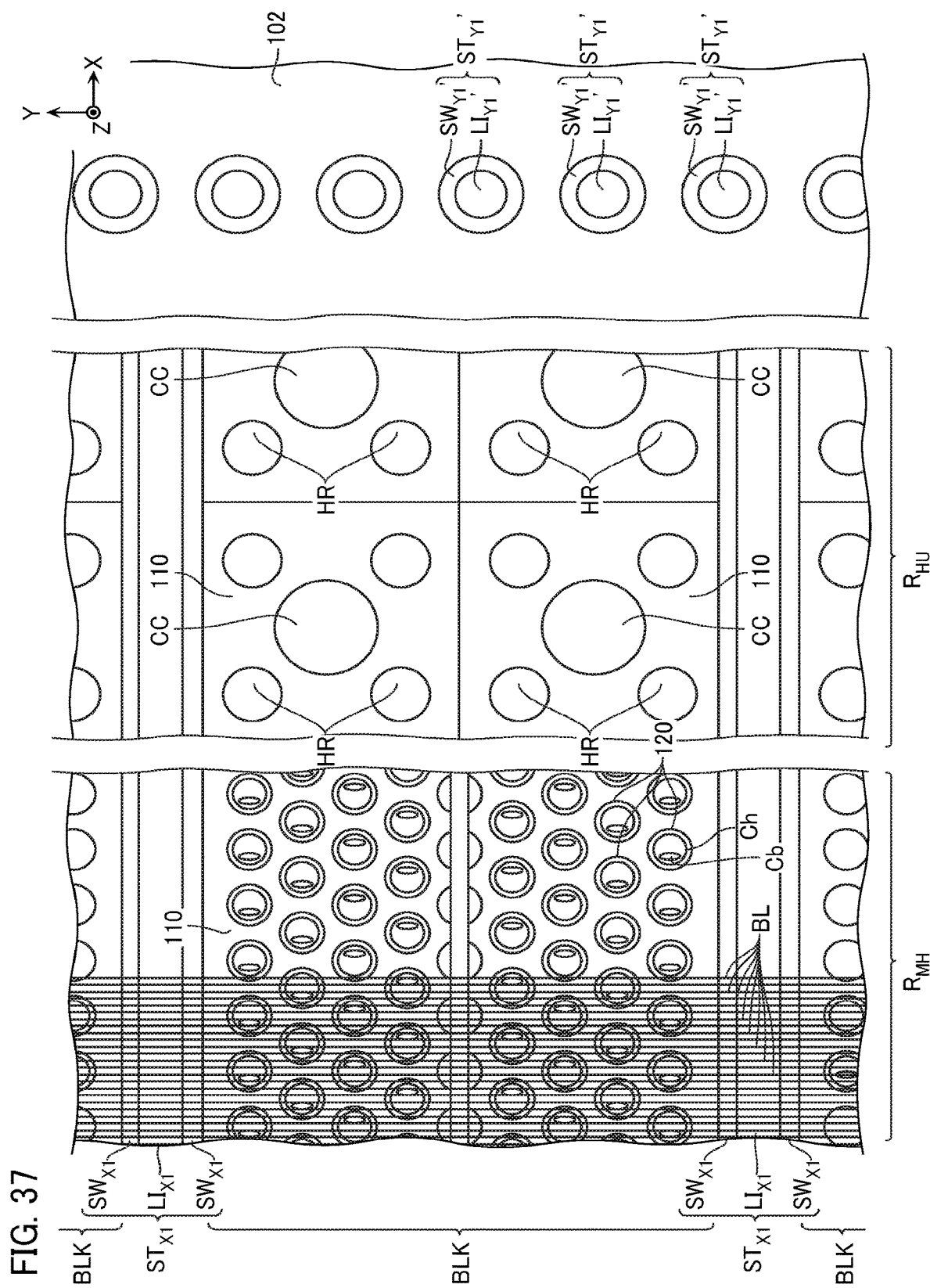
FIG. 37 is a schematic plan view illustrating a configuration of a part of a semiconductor memory device according to another embodiment.

In the above-described examples, the block side structures $ST_{Y1}$, $ST_{Y3}$, $ST_{Y4}$, and $ST_{Y5}$ have approximately plate shapes extending in the Z-direction and the Y-direction. However, for example, these block side structures may be formed in approximately columnar shapes as illustrated in, for example, FIG. 37. In this case, a plurality of block side structures $ST_{Y1}'$ are arranged in the Y-direction in a region between the memory cell array region $R_{MCA}$ and the row decoder region $R_{RD}$. Note that the block side structure $ST_{Y1}'$ illustrated in FIG. 37 includes a conductive layer $LI_{Y1}'$ and an insulating layer $SW_{Y1}'$. While the conductive layer $LI_{Y1}'$ is basically configured similarly to the conductive layer $LI_{Y1}$, the conductive layer $LI_{Y1}'$ is formed in an approximately columnar shape extending in the Z-direction. While the insulating layer $SW_{Y1}'$ is basically configured similarly to the insulating layer $SW_{Y1}$, the insulating layer $SW_{Y1}'$ is formed in an approximately columnar shape that covers an outer peripheral surface of the conductive layer $LI_{Y1}'$. FIG. 37 illustrates an example where the block side structure $ST_{Y1}'$ is formed in an approximately columnar shape. However, for example, the block side structures $ST_{Y3}$, $ST_{Y4}$, and $ST_{Y5}$ according to the other embodiments also can be formed in approximately columnar shapes.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
two memory blocks arranged in a first direction, the two memory blocks extending in a second direction intersecting with the first direction;
a first structure disposed between the two memory blocks, the first structure extending in the second direction;
a second structure separated from the two memory blocks in the second direction, the second structure extending in the first direction; and
a plurality of bit lines arranged in the second direction, the plurality of bit lines extending in the first direction and being connected to the two memory blocks, wherein
the two memory blocks include a plurality of first conductive layers and a plurality of first insulating layers alternately arranged in a third direction intersecting with a surface of the substrate,
the first structure has a first end parallel to the surface of the substrate and a second end parallel to the surface of the substrate, and the first end is closer to the substrate than the plurality of first conductive layers and the second end,
the second structure has a third end parallel to the surface of the substrate and a fourth end parallel to the surface of the substrate, and the third end is closer to the substrate than at least a part of the first conductive layers among the plurality of first conductive layers and the fourth end,
the second end of the first structure and the fourth end of the second structure are farther from the substrate than the plurality of first conductive layers and closer to the substrate than the plurality of bit lines,
the third end and the fourth end of the second structure extend in the first direction, a length of each of the third end and the fourth end of the second structure in the first direction is greater than a width of at least one of the two memory blocks in the first direction, and
the second structure is separated from the first structure in the second direction.

2. The semiconductor memory device according to claim 1, wherein
the second structure has a width in the second direction smaller than a width in the first direction of the first structure.

3. The semiconductor memory device according to claim 2, wherein
the third end of the second structure is farther from the substrate than one of the plurality of first conductive layers closest to the substrate.

4. The semiconductor memory device according to claim 1, wherein
the second structure has a width in the second direction greater than a width in the first direction of the first structure.

5. The semiconductor memory device according to claim 1, wherein
the second structure includes a second conductive layer extending in the first direction.

6. The semiconductor memory device according to claim 5, wherein
the second conductive layer is electrically connected to an external terminal configured to supply a ground voltage.

7. The semiconductor memory device according to claim 1, wherein
the substrate includes a first well region,
the two memory blocks are disposed on or above the first well region, and
the second structure is disposed at a position overlapping the first well region viewed in the third direction.

8. The semiconductor memory device according to claim 7, wherein
the second structure includes a second conductive layer extending in the first direction, and
the second conductive layer is connected to the first well region.

9. The semiconductor memory device according to claim 1, wherein
the second structure includes a second conductive layer extending in the first direction,
the semiconductor memory device includes:
a second insulating layer disposed on the surface of the substrate;
a first semiconductor layer disposed on a surface of the second insulating layer, and
a third conductive layer disposed on a surface of the first semiconductor layer, and
the second conductive layer is connected to the third conductive layer.

10. The semiconductor memory device according to claim 7, comprising
a third structure separated from the two memory blocks in the second direction, the third structure extends in the first direction, wherein
the third structure includes a fourth conductive layer extending in the first direction,
the substrate includes a second well region,
the first well region is disposed in the second well region, and
the fourth conductive layer is connected to the second well region.

11. The semiconductor memory device according to claim 7, comprising
a plurality of third structures separated from the two memory blocks in the second direction, the plurality of third structures being disposed in the first direction, wherein
the third structure includes a fourth conductive layer extending in the first direction,
the substrate includes a second well region,
the first well region is disposed in the second well region, and
the fourth conductive layer is connected to the second well region.

12. The semiconductor memory device according to claim 1, comprising
a second semiconductor layer disposed between the substrate and the two memory blocks, wherein
the second structure is disposed at a position overlapping the second semiconductor layer viewed in the third direction.

13. The semiconductor memory device according to claim 12, wherein
the second structure includes a second conductive layer extending in the first direction, and
the second conductive layer is connected to the second semiconductor layer.

14. The semiconductor memory device according to claim 1, comprising
a third insulating layer that covers at least a part of a side surface in the second direction of the second structure.

15. The semiconductor memory device according to claim 1, further comprising:
a third structure disposed in parallel with the second structure, the second structure provided between the two memory blocks and the third structure.

16. The semiconductor memory device according to claim 15,
wherein the third structure has a fifth end extending in the first direction and a sixth end extending in the first direction, the fifth end and the sixth end are parallel to the surface of the substrate, a length of each of the fifth end and the sixth end in the first direction is greater than the width of the at least one of the two memory blocks in the first direction,
wherein the fifth end is closer to the substrate than the sixth end, and
wherein the sixth end is farther from the substrate than the plurality of first conductive layers and closer to the substrate than the plurality of bit lines.

17. A semiconductor memory device comprising:
a substrate;
two memory blocks arranged in a first direction, the two memory blocks extending in a second direction intersecting with the first direction;
a first structure disposed between the two memory blocks, the first structure extending in the second direction;
a second structure separated from the two memory blocks in the second direction, the second structure extending in the first direction; and
a plurality of bit lines arranged in the second direction, the plurality of bit lines extending in the first direction and being connected to the two memory blocks, wherein
the two memory blocks include a plurality of first conductive layers and a plurality of first insulating layers alternately arranged in a third direction intersecting with a surface of the substrate,
the first structure has a first end parallel to the surface of the substrate and a second end parallel to the surface of the substrate, and the first end is closer to the substrate than the plurality of first conductive layers and the second end,
the second structure has a third end parallel to the surface of the substrate and a fourth end parallel to the surface of the substrate, and the third end is closer to the substrate than at least a part of the first conductive layers among the plurality of first conductive layers and the fourth end,
the second structure has a generally rectangular shape including a first side extending along the first direction and a second side extending along the third direction, the first side corresponding to the fourth end, a length of the first side being greater than a width of at least one of the two memory blocks along the first direction, a length of the second side being greater than a width of the at least one of the two memory blocks along the third direction,
the second end of the first structure and the fourth end of the second structure are farther from the substrate than the plurality of first conductive layers and closer to the substrate than the plurality of bit lines, and
the second structure is separated from the first structure in the second direction.

18. The semiconductor memory device according to claim 17, wherein
the second structure has a width in the second direction smaller than a width in the first direction of the first structure.

19. The semiconductor memory device according to claim 17, wherein
the second structure has a width in the second direction greater than a width in the first direction of the first structure.

20. The semiconductor memory device according to claim 17, wherein
the second structure includes a second conductive layer extending in the first direction.

* * * * *